United States Patent
Wehrly, Jr. et al.

(10) Patent No.: US 7,737,549 B2
(45) Date of Patent: *Jun. 15, 2010

(54) CIRCUIT MODULE WITH THERMAL CASING SYSTEMS

(75) Inventors: James Douglas Wehrly, Jr., Austin, TX (US); James Wilder, Austin, TX (US); Mark Wolfe, Round Rock, TX (US); Paul Goodwin, Austin, TX (US)

(73) Assignee: Entorian Technologies LP, Austin, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 12/263,060

(22) Filed: Oct. 31, 2008

(65) Prior Publication Data

US 2009/0052124 A1    Feb. 26, 2009

Related U.S. Application Data

(63) Continuation of application No. 11/283,355, filed on Nov. 18, 2005, now Pat. No. 7,446,410.

(51) Int. Cl.
*H01L 23/34* (2006.01)
*H05K 7/20* (2006.01)
*H01L 21/00* (2006.01)

(52) U.S. Cl. .................. 257/707; 257/713; 257/717; 257/724; 257/730; 257/E23.101; 361/709; 361/717; 361/719; 361/749; 438/122

(58) Field of Classification Search .................. None
See application file for complete search history.

(56) References Cited

U.S. PATENT DOCUMENTS 3,372,310 A    3/1968    Kantor (Continued)

FOREIGN PATENT DOCUMENTS

EP    122-687 (A)    10/1984

(Continued)

OTHER PUBLICATIONS

PCT/US05/28547 International Search Report and Written Opinion, PCT, Aug. 18, 2006.

(Continued)

*Primary Examiner*—Alonzo Chambliss
(74) *Attorney, Agent, or Firm*—Civins Denko et al. LLP

(57) ABSTRACT

Flexible circuitry is populated with integrated circuitry (ICs), and contacts are distributed along the flexible circuitry to provide connection to an application environment. The flexible circuitry is disposed about a rigid substrate, placing the ICs on one or both sides of the substrate with one or more layers of integrated circuitry on one or both sides of the substrate. The substrate is preferably devised from thermally-conductive materials and one or more thermal spreaders are in thermal contact with at least some of the ICs. Optionally, as an additional thermal management feature, the module may include a high thermal conductivity thermal sink or area that is disposed proximal to higher thermal energy IC devices. In preferred embodiments, extensions from the substrate body or substrate core encourage reduced thermal variations amongst the ICs of the module while providing an enlarged surface for shedding thermal energy from the module.

6 Claims, 17 Drawing Sheets

U.S. PATENT DOCUMENTS

| | | |
|---|---|---|
| 3,436,604 A | 4/1969 | Hyltin |
| 3,582,865 A | 6/1971 | Franck et al |
| 3,654,394 A | 4/1972 | Gordon |
| 3,704,455 A | 11/1972 | Scarbrough |
| 3,718,842 A | 2/1973 | Abbott, III et al. |
| 3,727,064 A | 4/1973 | Bottini |
| 3,746,934 A | 7/1973 | Stein |
| 3,766,439 A | 10/1973 | Isaacson |
| 3,772,776 A | 11/1973 | Weisenburger |
| 4,169,642 A | 10/1979 | Mouissie |
| 4,288,841 A | 9/1981 | Gogal |
| 4,342,069 A | 7/1982 | Link |
| 4,429,349 A | 1/1984 | Zachry |
| 4,437,235 A | 3/1984 | McIver |
| 4,513,368 A | 4/1985 | Houseman |
| 4,547,834 A | 10/1985 | Dumont et al. |
| 4,567,543 A | 1/1986 | Miniet |
| 4,587,596 A | 5/1986 | Bunnell |
| 4,645,944 A | 2/1987 | Uya |
| 4,656,605 A | 4/1987 | Clayton |
| 4,672,421 A | 6/1987 | Lin |
| 4,682,207 A | 7/1987 | Akasaki et al. |
| 4,696,525 A | 9/1987 | Coller et al. |
| 4,709,300 A | 11/1987 | Landis |
| 4,724,611 A | 2/1988 | Hagihara |
| 4,727,513 A | 2/1988 | Clayton |
| 4,733,461 A | 3/1988 | Nakano |
| 4,739,589 A | 4/1988 | Brehm et al. |
| 4,763,188 A | 8/1988 | Johnson |
| 4,771,366 A | 9/1988 | Blake et al. |
| 4,821,007 A | 4/1989 | Fields et al. |
| 4,823,234 A | 4/1989 | Konishi et al. |
| 4,833,568 A | 5/1989 | Berhold |
| 4,850,892 A | 7/1989 | Clayton et al. |
| 4,862,249 A | 8/1989 | Carlson |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 4,992,849 A | 2/1991 | Corbett et al. |
| 4,992,850 A | 2/1991 | Corbett et al. |
| 5,014,115 A | 5/1991 | Moser |
| 5,014,161 A | 5/1991 | Lee et al. |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,053,853 A | 10/1991 | Haj-Ali-Ahmadi et al. |
| 5,065,277 A | 11/1991 | Davidson |
| 5,099,393 A | 3/1992 | Bentlage et al. |
| 5,104,820 A | 4/1992 | Go et al. |
| 5,109,318 A | 4/1992 | Funari et al. |
| 5,117,282 A | 5/1992 | Salatino |
| 5,119,269 A | 6/1992 | Nakayama |
| 5,138,430 A | 8/1992 | Gow, III et al. |
| 5,138,434 A | 8/1992 | Wood et al. |
| 5,140,405 A | 8/1992 | King et al. |
| 5,159,535 A | 10/1992 | Desai et al. |
| 5,173,840 A | 12/1992 | Kodai et al. |
| 5,191,404 A | 3/1993 | Wu et al. |
| 5,208,729 A | 5/1993 | Cipolla et al. |
| 5,214,845 A | 6/1993 | King et al. |
| 5,219,377 A | 6/1993 | Poradish |
| 5,222,014 A | 6/1993 | Lin |
| 5,224,023 A | 6/1993 | Smith et al. |
| 5,229,916 A | 7/1993 | Frankeny et al. |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewiez et al. |
| 5,247,423 A | 9/1993 | Lin et al. |
| 5,252,857 A | 10/1993 | Kane et al. |
| 5,259,770 A | 11/1993 | Bates et al. |
| 5,261,068 A | 11/1993 | Gaskins et al. |
| 5,268,815 A | 12/1993 | Cipolla et al. |
| 5,276,418 A | 1/1994 | Klosowiak et al. |
| 5,281,852 A | 1/1994 | Normington |
| 5,285,398 A | 2/1994 | Janik |
| 5,289,062 A | 2/1994 | Wyland |
| 5,309,986 A | 5/1994 | Itoh |
| 5,313,097 A | 5/1994 | Haj-Ali-Ahmadi et al. |
| 5,347,428 A | 9/1994 | Carson et al. |
| 5,362,656 A | 11/1994 | McMahon |
| 5,375,041 A | 12/1994 | McMahon |
| 5,386,341 A | 1/1995 | Olson et al. |
| 5,394,300 A | 2/1995 | Yoshimura |
| 5,397,916 A | 3/1995 | Normington |
| 5,400,003 A | 3/1995 | Kledzik |
| 5,428,190 A | 6/1995 | Stopperan |
| 5,438,224 A | 8/1995 | Papageorge et al. |
| 5,448,511 A | 9/1995 | Paurus et al. |
| 5,477,082 A | 12/1995 | Buckley, III et al. |
| 5,491,612 A | 2/1996 | Nicewarner, Jr. et al. |
| 5,502,333 A | 3/1996 | Bertin et al. |
| 5,523,619 A | 6/1996 | McAllister et al. |
| 5,523,695 A | 6/1996 | Lin |
| 5,541,812 A | 7/1996 | Burns |
| 5,572,065 A | 11/1996 | Burns |
| 5,600,178 A | 2/1997 | Russell |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner et al. |
| 5,654,877 A | 8/1997 | Burns |
| 5,661,339 A | 8/1997 | Clayton |
| 5,686,730 A | 11/1997 | Laudon et al. |
| 5,688,606 A | 11/1997 | Mahulikar et al. |
| 5,708,297 A | 1/1998 | Clayton |
| 5,714,802 A | 2/1998 | Cloud et al. |
| 5,717,556 A | 2/1998 | Yanagida |
| 5,729,894 A | 3/1998 | Rostoker et al. |
| 5,731,633 A | 3/1998 | Clayton |
| 5,744,862 A | 4/1998 | Ishii |
| 5,751,553 A | 5/1998 | Clayton |
| 5,754,409 A | 5/1998 | Smith |
| 5,764,497 A | 6/1998 | Mizumo |
| 5,776,797 A | 7/1998 | Nicewarner, Jr. et al. |
| 5,789,815 A | 8/1998 | Tessier et al. |
| 5,790,447 A | 8/1998 | Laudon et al. |
| 5,802,395 A | 9/1998 | Connolly et al. |
| 5,805,422 A | 9/1998 | Otake et al. |
| 5,828,125 A | 10/1998 | Burns |
| 5,835,988 A | 11/1998 | Ishii |
| 5,869,353 A | 2/1999 | Levy et al. |
| 5,899,705 A | 5/1999 | Akram |
| 5,917,709 A | 6/1999 | Johnson et al. |
| 5,925,934 A | 7/1999 | Lim |
| 5,926,369 A | 7/1999 | Ingraham et al. |
| 5,949,657 A | 9/1999 | Karabatsos |
| 5,953,214 A | 9/1999 | Dranchak et al. |
| 5,953,215 A | 9/1999 | Karabatsos |
| 5,959,839 A | 9/1999 | Gates |
| 5,963,427 A | 10/1999 | Bolleson |
| 5,973,395 A | 10/1999 | Suzuki et al. |
| 5,995,370 A | 11/1999 | Nakamori |
| 6,002,167 A | 12/1999 | Hatano et al. |
| 6,002,589 A | 12/1999 | Perino et al. |
| 6,008,538 A | 12/1999 | Akram et al. |
| 6,014,316 A | 1/2000 | Eide |
| 6,021,048 A | 2/2000 | Smith |

| | | | |
|---|---|---|---|
| 6,025,992 A | 2/2000 | Dodge et al. |
| 6,028,352 A | 2/2000 | Eide |
| 6,028,365 A | 2/2000 | Akram et al. |
| 6,034,878 A | 3/2000 | Osaka et al. |
| 6,038,132 A | 3/2000 | Tokunaga et al. |
| 6,040,624 A | 3/2000 | Chambers et al. |
| 6,049,975 A | 4/2000 | Clayton |
| 6,060,339 A | 5/2000 | Akram et al. |
| 6,072,233 A | 6/2000 | Corisis et al. |
| 6,078,515 A | 6/2000 | Nielsen et al. |
| 6,084,294 A | 7/2000 | Tomita |
| 6,091,145 A | 7/2000 | Clayton |
| 6,097,087 A | 8/2000 | Farnworth et al. |
| 6,111,757 A | 8/2000 | Dell et al. |
| 6,121,676 A | 9/2000 | Solberg |
| RE36,916 E | 10/2000 | Moshayedi |
| 6,157,541 A | 12/2000 | Hacke |
| 6,172,874 B1 | 1/2001 | Bartilson |
| 6,178,093 B1 | 1/2001 | Bhatt et al. |
| 6,180,881 B1 | 1/2001 | Isaak |
| 6,187,652 B1 | 2/2001 | Chou et al. |
| 6,205,654 B1 | 3/2001 | Burns |
| 6,208,521 B1 | 3/2001 | Nakatsuka |
| 6,208,546 B1 | 3/2001 | Ikeda |
| 6,214,641 B1 | 4/2001 | Akram |
| 6,215,181 B1 | 4/2001 | Akram et al. |
| 6,215,687 B1 | 4/2001 | Sugano et al. |
| 6,222,737 B1 | 4/2001 | Ross |
| 6,222,739 B1 | 4/2001 | Bhakta et al. |
| 6,225,688 B1 | 5/2001 | Kim et al. |
| 6,232,659 B1 | 5/2001 | Clayton |
| 6,233,650 B1 | 5/2001 | Johnson et al. |
| 6,234,820 B1 | 5/2001 | Perino et al. |
| 6,262,476 B1 | 7/2001 | Vidal |
| 6,262,895 B1 | 7/2001 | Forthun |
| 6,265,660 B1 | 7/2001 | Tandy |
| 6,266,252 B1 | 7/2001 | Karabatsos |
| 6,281,577 B1 | 8/2001 | Oppermann et al. |
| 6,288,907 B1 | 9/2001 | Burns |
| 6,288,924 B1 | 9/2001 | Sugano et al. |
| 6,300,679 B1 | 10/2001 | Mukerji et al. |
| 6,316,825 B1 | 11/2001 | Park et al. |
| 6,323,060 B1 | 11/2001 | Isaak |
| 6,336,262 B1 | 1/2002 | Dalal et al. |
| 6,343,020 B1 | 1/2002 | Lin et al. |
| 6,347,394 B1 | 2/2002 | Ochoa et al. |
| 6,349,050 B1 | 2/2002 | Woo et al. |
| 6,351,029 B1 | 2/2002 | Isaak |
| 6,357,023 B1 | 3/2002 | Co et al. |
| 6,358,772 B2 | 3/2002 | Miyoshi |
| 6,360,433 B1 | 3/2002 | Ross |
| 6,368,896 B2 | 4/2002 | Farnworth et al. |
| 6,370,668 B1 | 4/2002 | Garrett, Jr. et al. |
| 6,376,769 B1 | 4/2002 | Chung |
| 6,392,162 B1 | 5/2002 | Karabatsos |
| 6,404,043 B1 | 6/2002 | Isaak |
| 6,410,857 B1 | 6/2002 | Gonya |
| 6,426,240 B2 | 7/2002 | Isaak |
| 6,426,549 B1 | 7/2002 | Isaak |
| 6,426,560 B1 | 7/2002 | Kawamura et al. |
| 6,428,360 B2 | 8/2002 | Hassanzadeh et al. |
| 6,433,418 B1 | 8/2002 | Fujisawa et al. |
| 6,444,921 B1 | 9/2002 | Wang et al. |
| 6,446,158 B1 | 9/2002 | Karabatsos |
| 6,449,159 B1 | 9/2002 | Haba |
| 6,452,826 B1 | 9/2002 | Kim et al. |
| 6,459,152 B1 | 10/2002 | Tomita et al. |
| 6,462,412 B2 | 10/2002 | Kamei et al. |
| 6,465,877 B1 | 10/2002 | Farnworth et al. |
| 6,465,893 B1 | 10/2002 | Khandros et al. |
| 6,472,735 B2 | 10/2002 | Isaak |
| 6,473,308 B2 | 10/2002 | Forthun |
| 6,486,544 B1 | 11/2002 | Hashimoto |
| 6,489,687 B1 | 12/2002 | Hashimoto |
| 6,502,161 B1 | 12/2002 | Perego et al. |
| 6,514,793 B2 | 2/2003 | Isaak |
| 6,521,984 B2 | 2/2003 | Matsuura |
| 6,528,870 B2 | 3/2003 | Fukatsu et al. |
| 6,531,772 B2 | 3/2003 | Akram et al. |
| 6,544,815 B2 | 4/2003 | Isaak |
| 6,552,910 B1 | 4/2003 | Moon et al. |
| 6,552,948 B2 | 4/2003 | Woo et al. |
| 6,560,117 B2 | 5/2003 | Moon |
| 6,566,746 B2 | 5/2003 | Isaak et al. |
| 6,572,387 B2 | 6/2003 | Burns et al. |
| 6,573,593 B1 | 6/2003 | Syri et al. |
| 6,576,992 B1 | 6/2003 | Cady et al. |
| 6,588,095 B2 | 7/2003 | Pan |
| 6,590,282 B1 | 7/2003 | Wang et al. |
| 6,600,222 B1 | 7/2003 | Levardo |
| 6,614,664 B2 | 9/2003 | Lee |
| 6,627,984 B2 | 9/2003 | Bruce et al. |
| 6,629,855 B1 | 10/2003 | North et al. |
| 6,646,936 B2 | 11/2003 | Hamamatsu et al. |
| 6,660,561 B2 | 12/2003 | Forthun |
| 6,661,092 B2 | 12/2003 | Shibata et al. |
| 6,677,670 B2 | 1/2004 | Kondo |
| 6,683,377 B1 | 1/2004 | Shim et al. |
| 6,690,584 B2 | 2/2004 | Uzuka et al. |
| 6,699,730 B2 | 3/2004 | Kim et al. |
| 6,720,652 B2 | 4/2004 | Akram et al. |
| 6,721,181 B1 | 4/2004 | Pfeifer et al. |
| 6,721,185 B2 | 4/2004 | Dong et al. |
| 6,721,226 B2 | 4/2004 | Woo et al. |
| 6,744,656 B2 | 6/2004 | Sugano et al. |
| 6,751,113 B2 | 6/2004 | Bhakta et al. |
| 6,756,661 B2 | 6/2004 | Tsuneda et al. |
| 6,760,220 B2 | 7/2004 | Canter et al. |
| 6,762,942 B1 | 7/2004 | Smith |
| 6,768,660 B2 | 7/2004 | Kong et al. |
| 6,833,981 B2 | 12/2004 | Suwabe et al. |
| 6,833,984 B1 | 12/2004 | Belgacem |
| 6,839,266 B1 | 1/2005 | Garrett, Jr. et al. |
| 6,841,868 B2 | 1/2005 | Akram et al. |
| 6,850,414 B2 | 2/2005 | Benisek et al. |
| 6,873,534 B2 | 3/2005 | Bhakta et al. |
| 6,878,571 B2 | 4/2005 | Isaak et al. |
| 6,884,653 B2 | 4/2005 | Larson |
| 6,914,324 B2 | 7/2005 | Rapport et al. |
| 6,919,626 B2 | 7/2005 | Burns |
| 6,956,284 B2 | 10/2005 | Cady et al. |
| 7,053,478 B2 | 5/2006 | Roper et al. |
| 7,094,632 B2 | 8/2006 | Cady et al. |
| 7,180,167 B2 | 2/2007 | Partridge et al. |
| 7,393,226 B2 | 7/2008 | Clayton et al. |
| 7,394,149 B2 | 7/2008 | Clayton et al. |
| 7,443,023 B2 * | 10/2008 | Wehrly et al. ............... 257/707 |
| 7,446,410 B2 * | 11/2008 | Wehrly et al. ............... 257/707 |
| 7,459,784 B2 * | 12/2008 | Wehrly et al. ............... 257/707 |
| 2001/0001085 A1 | 5/2001 | Hassanzadeh et al. |
| 2001/0006252 A1 | 7/2001 | Kim et al. |
| 2001/0013423 A1 | 8/2001 | Dalal et al. |
| 2001/0015487 A1 | 8/2001 | Forthun |
| 2001/0026009 A1 | 10/2001 | Tsuneda et al. |
| 2001/0028588 A1 | 10/2001 | Yamada et al. |
| 2001/0035572 A1 | 11/2001 | Isaak |
| 2001/0040793 A1 | 11/2001 | Inaba |
| 2001/0052637 A1 | 12/2001 | Akram et al. |
| 2002/0001216 A1 | 1/2002 | Sugano et al. |
| 2002/0006032 A1 | 1/2002 | Karabatsos |
| 2002/0030995 A1 | 3/2002 | Shoji |
| 2002/0076919 A1 | 6/2002 | Peters et al. |
| 2002/0094603 A1 | 7/2002 | Isaak |
| 2002/0101261 A1 | 8/2002 | Karabatsos |
| 2002/0139577 A1 | 10/2002 | Miller |
| 2002/0164838 A1 | 11/2002 | Moon et al. |

| | | | |
|---|---|---|---|
| 2002/0180022 | A1 | 12/2002 | Emoto |
| 2002/0185731 | A1 | 12/2002 | Akram et al. |
| 2002/0196612 | A1 | 12/2002 | Gall et al. |
| 2003/0002262 | A1 | 1/2003 | Benisek et al. |
| 2003/0026155 | A1 | 2/2003 | Yamagata |
| 2003/0035328 | A1 | 2/2003 | Hamamatsu et al. |
| 2003/0045025 | A1 | 3/2003 | Coyle et al. |
| 2003/0049886 | A1 | 3/2003 | Salmon |
| 2003/0064548 | A1 | 4/2003 | Isaak |
| 2003/0081387 | A1 | 5/2003 | Schulz |
| 2003/0081392 | A1 | 5/2003 | Cady et al. |
| 2003/0089978 | A1 | 5/2003 | Miyamoto et al. |
| 2003/0090879 | A1 | 5/2003 | Doblar et al. |
| 2003/0096497 | A1 | 5/2003 | Moore et al. |
| 2003/0109078 | A1 | 6/2003 | Takahashi et al. |
| 2003/0116835 | A1 | 6/2003 | Miyamoto et al. |
| 2003/0159278 | A1 | 8/2003 | Peddle |
| 2003/0168725 | A1 | 9/2003 | Warner et al. |
| 2004/0000708 | A1 | 1/2004 | Rapport et al. |
| 2004/0012991 | A1 | 1/2004 | Kozaru |
| 2004/0021211 | A1 | 2/2004 | Damberg |
| 2004/0150107 | A1 | 8/2004 | Cha et al. |
| 2004/0229402 | A1 | 11/2004 | Cady et al. |
| 2004/0236877 | A1 | 11/2004 | Burton |
| 2005/0082663 | A1 | 4/2005 | Wakiyama et al. |
| 2005/0108468 | A1 | 5/2005 | Hazelzet et al. |
| 2005/0133897 | A1 | 6/2005 | Baek et al. |
| 2005/0242423 | A1 | 11/2005 | Partridge et al. |
| 2005/0263911 | A1 | 12/2005 | Igarashi et al. |
| 2006/0020740 | A1 | 1/2006 | Bartley et al. |
| 2006/0050496 | A1 | 3/2006 | Goodwin |
| 2006/0050497 | A1 | 3/2006 | Goodwin |
| 2006/0053345 | A1 | 3/2006 | Goodwin |
| 2006/0091529 | A1 | 5/2006 | Wehrly et al. |
| 2006/0095592 | A1 | 5/2006 | Borkenhagen |
| 2006/0111866 | A1 | 5/2006 | LeClerg et al. |
| 2006/0125067 | A1 | 6/2006 | Wehrly et al. |
| 2007/0211426 | A1 | 9/2007 | Clayton et al. |
| 2007/0211711 | A1 | 9/2007 | Clayton |
| 2007/0212906 | A1 | 9/2007 | Clayton et al. |
| 2007/0212920 | A1 | 9/2007 | Clayton et al. |
| 2008/0192428 | A1 | 8/2008 | Clayton et al. |

FOREIGN PATENT DOCUMENTS

| | | |
|---|---|---|
| EP | 0 298 211 A3 | 1/1989 |
| EP | 1 119049 A2 | 7/2001 |
| GB | 2 130 025 A | 5/1984 |
| JP | 53-85159 | 7/1978 |
| JP | 58-96756 (A) | 6/1983 |
| JP | 3-102862 | 4/1991 |
| JP | 5-29534 (A) | 2/1993 |
| JP | 5-335695 (A) | 12/1993 |
| JP | 2821315 (B2) | 11/1998 |
| JP | 2001/077294 (A) | 3/2001 |
| JP | 2001/085592 (A) | 3/2001 |
| JP | 2001/332683 (A) | 11/2001 |
| JP | 2002/009231 (A) | 11/2002 |
| JP | 2003/037246 (A) | 2/2003 |
| JP | 2003/086760 (A) | 3/2003 |
| JP | 2003/086761 (A) | 3/2003 |
| JP | 2003/309246 (A) | 10/2003 |
| JP | 2003/347503 (A) | 12/2003 |
| WO | WO03/037053 | 5/2003 |
| WO | WO 2004/109802 A1 | 12/2004 |

OTHER PUBLICATIONS

PCT/US05/28547 Notification Concerning Transmittal of International Preliminary Report on Patentability, Mar. 15, 2007.
GB 0516622.8 Search Report, May 25, 2006.
PCT/US06/04690 International Search Report, PCT, Feb. 16, 2007.
PCT/US06/04690 International Search Report, PCT, Jul. 20, 2007.
PCT/US06/38720 International Search Report and Written Opinion, PCT, Apr. 5, 2007.
PCT/US06/06921 International Search Report and Written Opinion, PCT, Jun. 1, 2007.
PCT/US06/007193; International Search Report and Written Opinion, PCT, Nov. 7, 2007.
pp. 19-22 of Presentation by Netlist, Aug. 2004.
Flexible Printed Circuit Technology—A Versatile Interconnection Option. (Website 2 pages) Fjelstad, Joseph. Dec. 3, 2002.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.
Tessera uZ Ball Stack Package. 4 figures that purport to be directed to the uZ—Ball Stacked Memory, Published on the Internet.
Chip Scale Review Online—An Independent Journal Dedicated to the Advancement of Chip-Scale Electronics. (Webiste 9 pages) Fjelstad, Joseph, Pacific Consultants L.LC., Published Jan. 2001 on Internet.
Flexible Thinking: Examining the Flexible Circuit Tapes. (Website 2 pages) Fjelstad, Joseph., Published Apr. 20, 2000 on Internet.
Ron Bauer, Intel. "Stacked-CSP Delivers Flexibility, Reliability, and Space-Saving Capabilities", vol. 3, Spring 2002. Published on the Internet.
Tessera Technologies, Inc.—Semiconductor Intellectual Property, Chip Scale Packaging—Website pp. (3), Internet.
Tessera Introduces uZ ä—Ball Stacked Memory Package for Computing and Portable Electronic Products Joyce Smaragdis, Tessera Public Relations, Sandy Skees, MCA PR (www.tessera.com/news_events/press_coverage.cfm); 2 figures that purport to be directed to the uZ ä—Ball Stacked Memory Package. Published Jul. 17, 2002 in San Jose, CA.
William R. Newberry, Design Techniques for Ball Grid Arrays, Xynetix Design Systems, Inc., Portland, Maine, Published on the Internet.
Chip Scale Packaging and Redistribution, Paul A. Magill, Glenn A. Rinne, J. Daniel Mis, Wayne C. Machon, Joseph W. Baggs, Unitive Electronics Inc.
Dense-Pac Microsystems, 16 Megabit High Speed CMOS SRAM DPS1MX I 6MKn3.
Dense-Pac Microsystems, 256 Megabyte CMOS DRAM DP3ED32MS72RW5.
Dense-Pac Microsystems, Breaking Space Barriers, 3-D Technology 1993.
Dense-Pac Microsystems, DPS512X16A3, Ceramic 512K X 16 CMOS SRAM Module.
IBM Preliminary 168 Pin SDRAM Registered DIMM Functional Description & Timing Diagrams.
3D Interconnection for Ultra-Dense Multichip Modules, Christian VAL, Thomson-CSF DCS Computer Division, Thierry Lemoine, Thomson-CSF RCM Radar Countermearusres Division.
High Density Memory Packaging Technology High Speed Imaging Applications, Dean Frew, Texas Instruments Incorporated.
Vertically-Integrated Package, Alvin Weinberg, Pacesetter, Inc. and W. Kinzy Jones, Florida International University.
Complaint filed Mar. 8, 2007, in the United States District Court for the District of Massachusetts, Boston Division, Civil Action No. 07 CA 10468 DPW.
Letter dated Sep. 11, 2006, from Chris Karabatsos of Kentron Technologies to John Kelly, President of JEDEC Solid State Technology Association, concerning potential interferences involving U.S. Appl. No. 11/306,803.

* cited by examiner

CIRCUIT MODULE WITH THERMAL CASING SYSTEMS

RELATED APPLICATIONS

This application is a continuation of U.S. patent application Ser. No. 11/283,355, filed Nov. 18, 2005, which is a continuation-in-part of U.S. patent application Ser. No. 11/231,418, filed Sep. 21, 2005, pending, which application is, in turn, a continuation-in-part of Pat. App. No. PCT/US05/28547 filed Aug. 10, 2005, pending, as well as a continuation-in-part of U.S. patent application Ser. No. 11/068,688 filed Mar. 1, 2005, pending, which application is a continuation-in-part of U.S. patent application Ser. No. 11/007,551 filed Dec. 8, 2004, pending, which application is a continuation-in-part of U.S. patent application Ser. No. 10/934,027 filed Sep. 3, 2004, pending. U.S. patent application Ser. No. 11/283,355 is also a continuation-in-part of U.S. patent application Ser. No. 11/005,992 filed Dec. 7, 2004, pending, which application is a continuation-in-part of U.S. patent application Ser. No. 10/934,027 filed Sep. 3, 2004. U.S. patent application Ser. No. 11/283,355 is also a continuation-in-part of U.S. patent application Ser. No. 11/193,954 filed Jul. 29, 2005, pending, which application is a continuation-in-part of U.S. patent application Ser. No. 11/007,551 filed Dec. 8, 2004, pending. U.S. patent application Ser. No. 11/283,355 is also a continuation-in-part of U.S. patent application Ser. No. 10/934,027 filed Sep. 3, 2004, pending. U.S. patent application Ser. No. 11/283,355 is also a continuation-in-part of U.S. patent application Ser. No. 11/123,721 filed May 6, 2005, pending, which application is a continuation-in-part of both U.S. patent application Ser. No. 11/068,688 filed Mar. 1, 2005 and U.S. patent application Ser. No. 11/005,992 filed Dec. 7, 2004, both of which are pending.

U.S. patent application Ser. No. 11/283,355; U.S. patent application Ser. No. 11/231,418; Pat. App. No. PCT/US05/28547; U.S. patent application Ser. No. 10/934,027; U.S. patent application Ser. No. 11/068,688; U.S. patent application Ser. No. 11/005,992; U.S. patent application Ser. No. 11/193,954; U.S. patent application Ser. No. 11/123,721; and U.S. patent application Ser. No. 11/007,551 are each hereby incorporated by reference herein.

FIELD

The present invention relates to systems and methods for creating high density circuit modules and, in particular, to systems and methods for creating such modules with features directed to reducing thermal loading.

BACKGROUND

Memory expansion is one of the many fields where high density circuit module solutions provide space-saving advantages. For example, the well-known DIMM (Dual In-line Memory Module) has been used for years, in various forms, to provide memory expansion. A typical DIMM includes a conventional PCB (printed circuit board) with memory devices and supporting digital logic devices mounted on both sides. The DIMM is typically mounted in the host computer system by inserting a contact-bearing edge of the DIMM into a card edge connector. Typically, systems that employ DIMMs provide limited profile space for such devices and conventional DIMM-based solutions have typically provided only a moderate amount of memory expansion.

As bus speeds have increased, fewer devices per channel can be reliably addressed with a DIMM-based solution. For example, 288 ICs or devices per channel may be addressed using the SDRAM-100 bus protocol with an unbuffered DIMM. Using the DDR-200 bus protocol, approximately 144 devices may be addressed per channel. With the DDR2-400 bus protocol, only 72 devices per channel may be addressed. This constraint has led to the development of the fully-buffered DIMM (FB-DIMM) with buffered C/A and data in which 288 devices per channel may be addressed. That buffering function is provided by what is typically identified as the Advanced Memory Buffer or AMB. With the FB-DIMM, not only has capacity increased, pin count has declined to approximately 69 signal pins from the approximately 240 pins previously required.

The FB-DIMM circuit solution is expected to offer practical motherboard memory capacities of up to about 192 gigabytes with six channels and eight DIMMs per channel and two ranks per DIMM using one gigabyte DRAMs. This solution should also be adaptable to next generation technologies and should exhibit significant downward compatibility.

There are several known methods to improve the limited capacity of a DIMM or other circuit board. In one strategy, for example, small circuit boards (daughter cards) are connected to the DIMM to provide extra mounting space. The additional connection may, however, cause flawed signal integrity for the data signals passing from the DIMM to the daughter card while the additional thickness of the daughter card(s) increases the profile of the module.

Multiple die packages (MDP) can also be used to increase DIMM capacity. This scheme increases the capacity of the memory devices on the DIMM by including multiple semiconductor die in a single device package. The additional heat generated by the multiple die typically requires, however, additional cooling capabilities to operate at maximum operating speed. Further, the MDP scheme may exhibit increased costs because of increased yield loss from packaging together multiple die that are not fully pre-tested.

Stacked packages are yet another way to increase module capacity. Capacity is increased by stacking packaged integrated circuits to create a high-density circuit module for mounting on the larger circuit board. In some techniques, flexible conductors are used to selectively interconnect packaged integrated circuits. Staktek Group L.P. has developed numerous systems for aggregating CSP (chipscale packaged) devices in space saving topologies. The increased component height of some stacking techniques may, however, alter system requirements such as, for example, required cooling airflow or the minimum spacing around a circuit board on its host system.

Typically, the known methods for improved memory module performance or enlarged capacity raise thermal management issues. For example, when a conventional packaged DRAM is mounted on a DIMM, the primary thermal path is through the balls of the package into the core of a multilayer DIMM that has less than desirable thermal characteristics. In particular, when an advanced memory buffer (AMB) is employed in an FB-DIMM, a significant amount of heat is generated. Consequently, the already marginal thermal shedding attributes of DIMM circuit modules is exacerbated in a typical FB-DIMM by the localized generation of heat by the AMB.

What is needed, therefore, are methods and structures for providing high capacity circuit boards in thermally-efficient, reliable designs that perform well at higher frequencies but are not too large, yet can be made at reasonable cost with commonly available and readily managed materials.

SUMMARY

Flexible circuitry is populated with integrated circuitry (ICs) disposed along one or both major sides of the flexible circuitry. Contacts are distributed along the flexible circuitry to provide connection between the module and an application environment. The populated flexible circuitry is supported by a rigid substrate, about which it is disposed in preferred embodiments, thus placing the integrated circuitry on one or both sides of the substrate with one or more layers of integrated circuitry on one or both sides of the substrate. The substrate is preferably devised from thermally-conductive materials and one or more thermal spreaders are disposed in thermal contact or connection with at least some of the constituent integrated circuitry of the module. Optionally, as an additional thermal management feature, the module may include a high thermal conductivity thermal sink or area that is disposed proximal to higher thermal energy IC devices. In preferred embodiments, extensions from the substrate body encourage reduced thermal variations amongst the ICs of the module while providing an enlarged surface for shedding thermal energy from the module.

DETAILED DESCRIPTION

Figure 1:
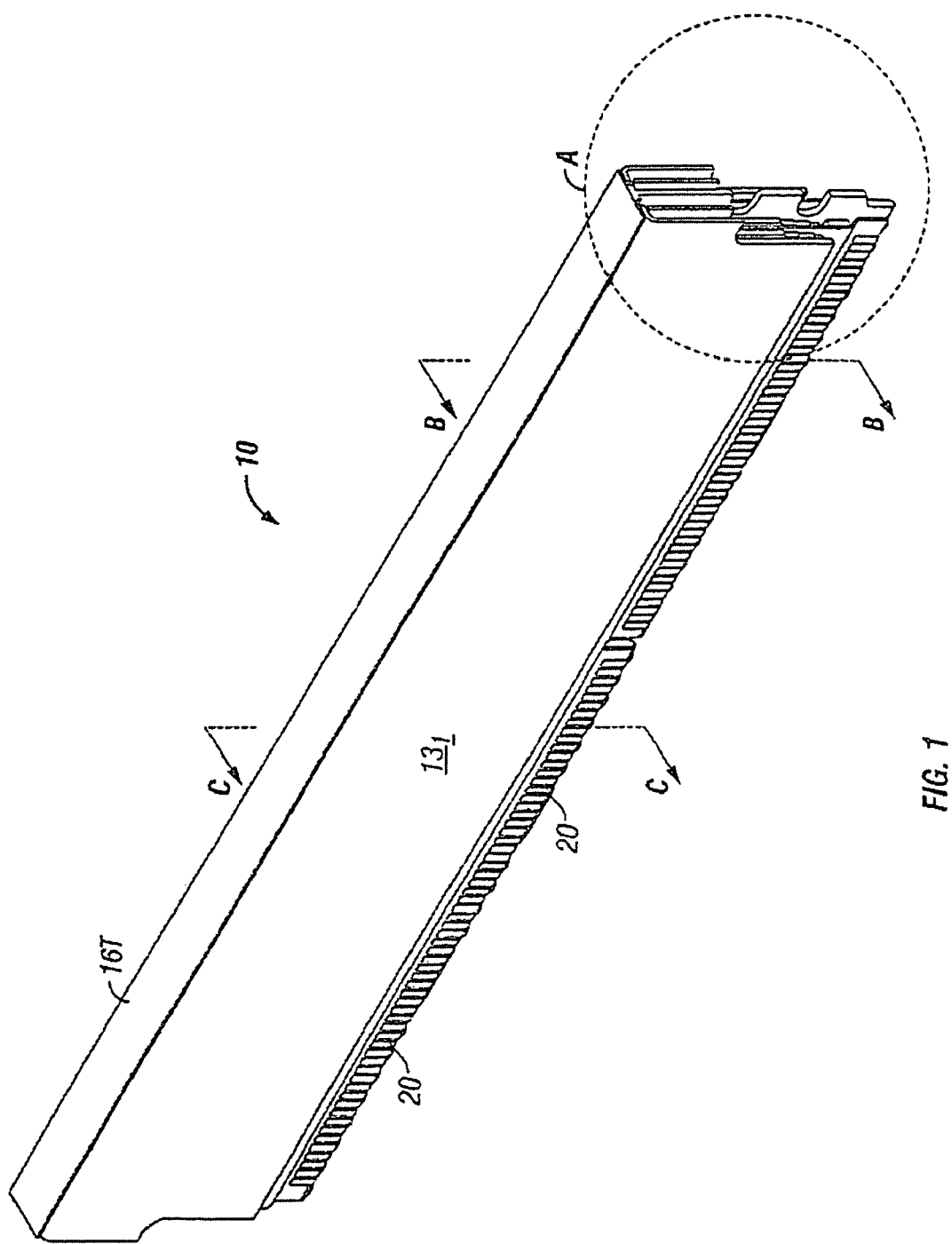
FIG. 1 depicts a perspective view of a module devised in accordance with a preferred embodiment of the present invention.
Figure 2:
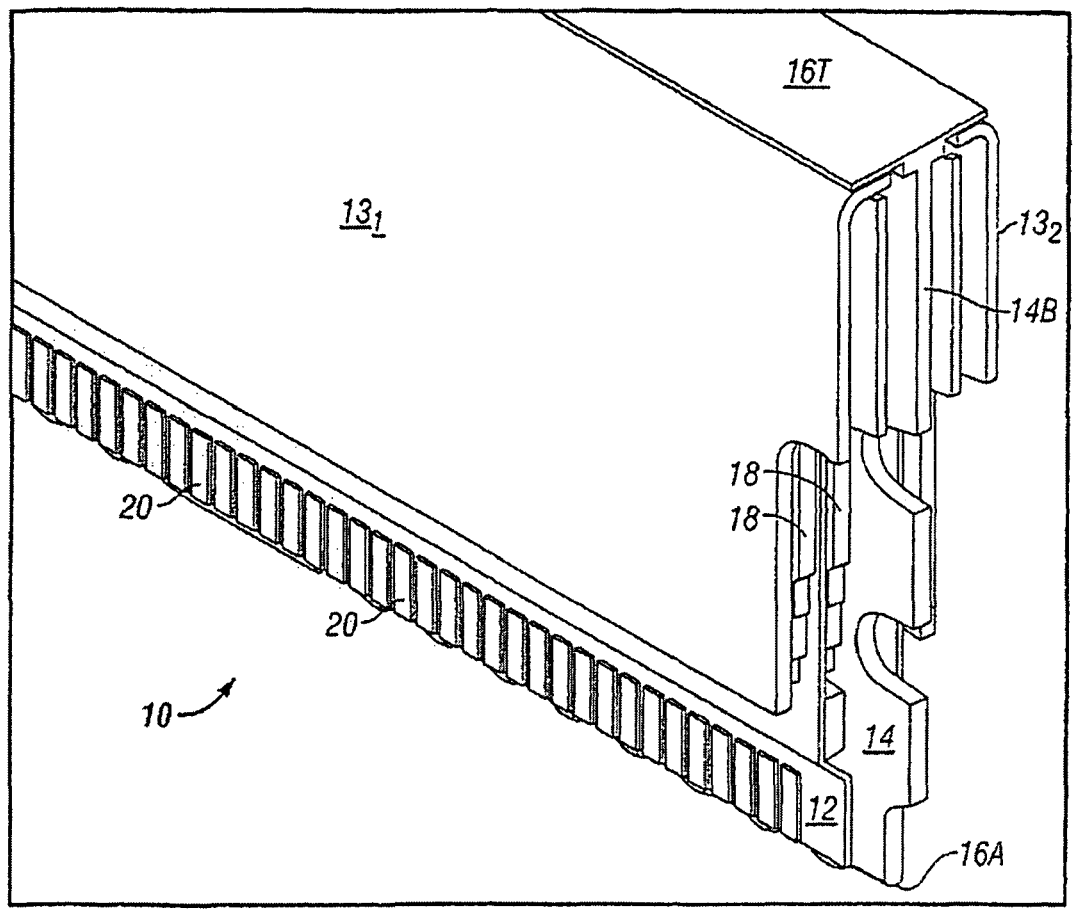
FIG. 2 is an enlarged view of the area marked "A" in FIG. 1.

FIGS. 1 and 2 depict a module 10 devised in accordance with a preferred embodiment of the present invention. The depictions illustrate module 10 having substrate 14 about which is disposed flex circuit 12 populated with ICs 18 which are, in a preferred embodiment, integrated circuitry in CSP packages. Some alternative embodiments will have separate flex circuit on each side of substrate 14. Substrate 14 is shown with an optional extension 16T which, in this embodiment, is integral with the body 14B of substrate 14.

Optional extension 16T may be devised in a variety of configurations and need not extend laterally from the main axis of substrate 14 in both directions. For example, extension 16T may extend from substrate 14 in only one direction and need not project perpendicular from the body 14B of substrate 14.

Preferably, substrate 14 is comprised of thermally conductive material. Metallic materials are preferred choices. For example, aluminum like many other metallic materials, is thermally conductive and may be readily manipulated for configuration as substrate 14. Materials such as FR4 may be employed, but if non-metallic materials are employed, other non-metallic materials that are thermally conductive are preferred over FR4. Carbon-based materials and certain plastics, for example, are known to readily conduct thermal energy and, as alternatives to metallic materials, such materials may be employed to advantage in preferred embodiments in accordance with the present invention where metallic materials are not available or wanted.

In the depicted embodiment, thermal spreaders $13_1$ and $13_2$ are thermally connected to ICs 18 and substrate 14. Thermal spreaders $13_1$ and $13_2$ are comprised of thermally conductive material with higher conductivity metallic materials being preferred. Aluminum is a preferred choice for thermal spreaders in this embodiment due to its amenability to fabrication and relatively high thermal conductivity. Those of skill will recognize, however, that use of copper and copper alloys for thermal spreaders $13_1$ and $13_2$ will typically provide even greater thermal benefits although at typically a higher cost. Thermal spreaders $13_1$ and $13_2$ are preferably thermally connected to ICs 18 (or other ICs where accessible) with thermal adhesive.

ICs 18 are partially shown in FIG. 2 with portions of profiles that represent just some of the many profiles that may be exhibited by ICs 18. ICs 18 on flexible circuit 12 are, in this preferred embodiment, CSP packaged memory devices of small scale. For purposes of this disclosure, the term chip-scale or "CSP", shall refer to integrated circuitry of any function with an array package providing connection to one or more die through contacts (often embodied as "bumps" or "balls" for example) distributed across a major surface of the package or die. CSP does not refer to leaded devices that provide connection to an integrated circuit within the package through leads emergent from at least one side of the periphery of the package such as, for example, a TSOP.

Embodiments of the present invention may be employed with leaded or CSP devices or other devices in both packaged and unpackaged forms but where the term CSP is used, the above definition for CSP should be adopted. Consequently, although CSP excludes leaded devices, references to CSP are to be broadly construed to include the large variety of array devices (and not to be limited to memory only) and whether die-sized or other size such as BGA and micro BGA as well as flip-chip. As those of skill will understand after appreciating this disclosure, some embodiments of the present invention may be devised to employ stacks of ICs each disposed where an IC 18 is indicated in the exemplar Figs.

Multiple integrated circuit die may be included in a package depicted as a single IC 18. While in this embodiment memory ICs are used to provide a memory expansion board or module, various embodiments may include a variety of integrated circuits and other components and may be directed principally to functions other than or in addition to memory. Such variety may include processors—whether general purpose or function specific such as graphics, FPGA's, RF transceiver circuitry, and digital logic as a list of non-limiting examples, while primary module functions may include, as a non limiting list of examples, memory, graphics, communications, and computing to name just a few examples. Some modules in accordance with a preferred embodiment will exhibit plural CSPs of a first type, such as memory CSPs, for example, and will have at, least one CSP of a second type, such as a microprocessor, graphics processor or buffer or, more-particularly, an AMB, for example. Other modules will exhibit ICs of only a first type such as memory CSPs, for example, while other modules may exhibit many types of ICs such as, for example, memory ICs, logic ICs, and one or more buffer ICs.

Figure 3:
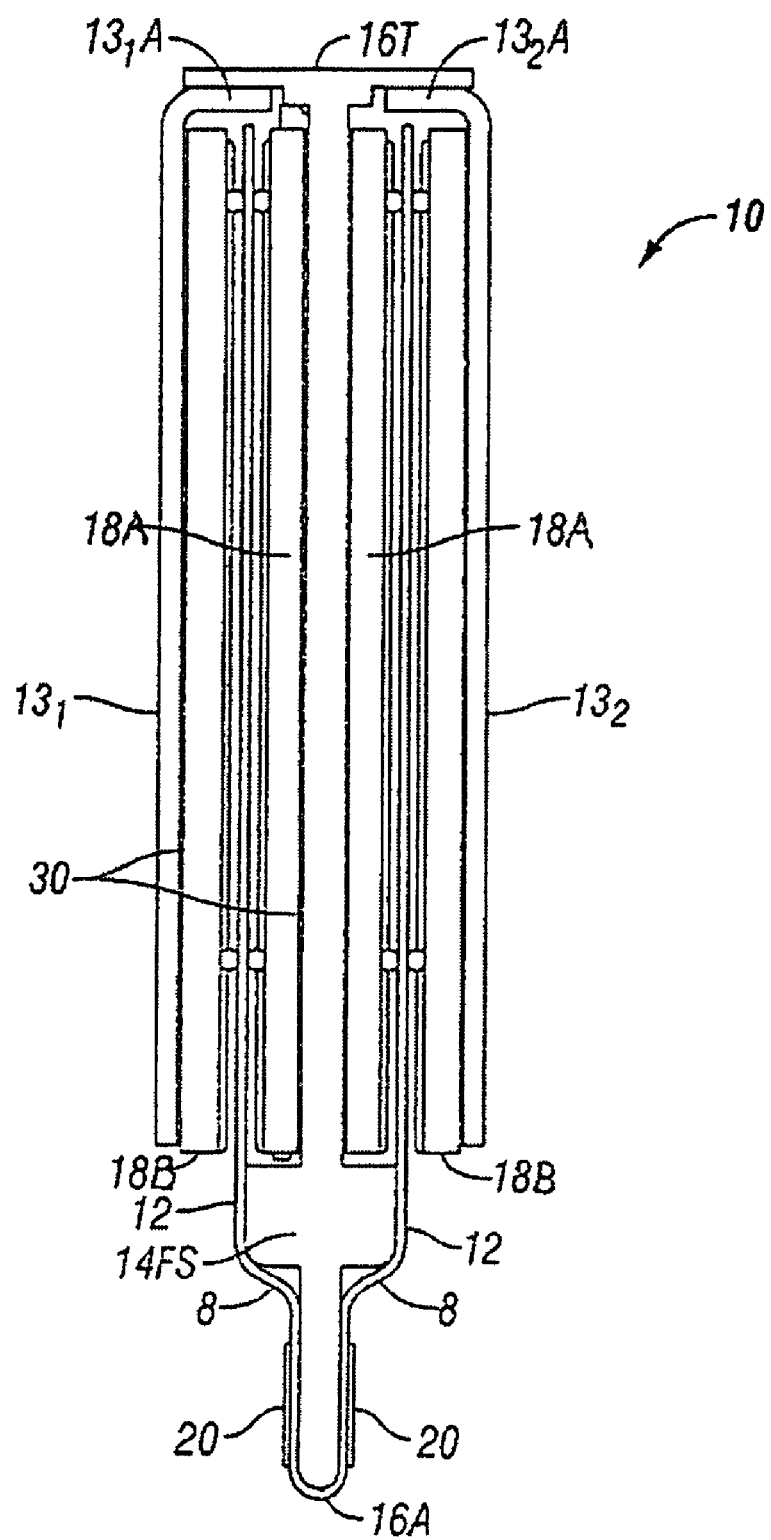
FIG. 3 is a cross-sectional depiction of a preferred embodiment taken along a perspective line that corresponds to line B-B of FIG. 1.

FIG. 3 is a cross-sectional depiction of an exemplar module 10 taken along a line corresponding to B-B of FIG. 1. ICs 18 are shown as being thermally connected to thermal spreaders 13$_1$ and 13$_2$. The thermal connection between thermal spreaders 13$_1$ and 13$_2$ and ICs 18 can be effectuated by direct contact or through an intermediate substance, particularly one that encourages thermal conduction. An example of such a substance is indicated in FIG. 3 with reference 30 representative of a thermal adhesive. Thermal adhesive is also preferred between ICs 18 and substrate 14 as shown. Optional flex support 14FS supports flex circuit 12 in its transition from end 16A of substrate 14 toward the ICs.

Figure 7:
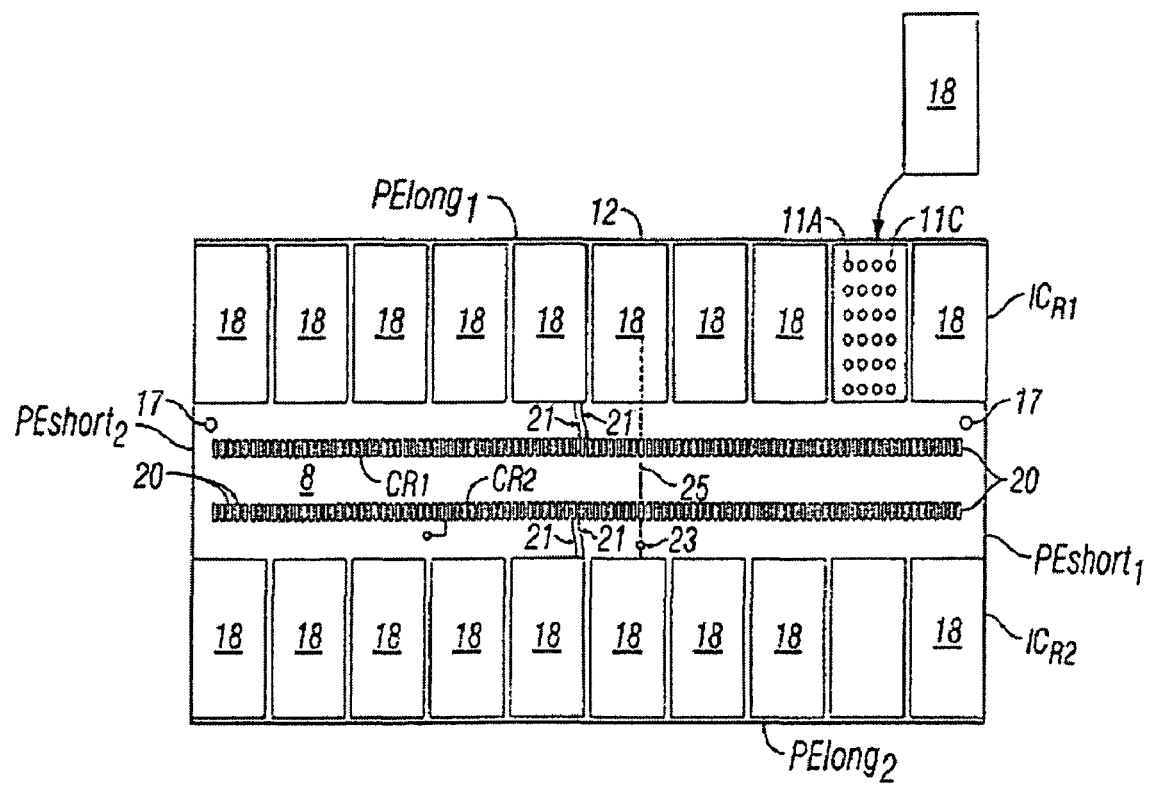
FIG. 7 depicts one side of a flex circuit employed in a preferred embodiment of the present invention.

Those of skill will also note that FIG. 3 may be also representative of a cross-sectional view through an exemplar module 10 along a line corresponding to C-C of FIG. 1 as well as line B-B in those instances where module 10 consists primarily of ICs 18 along its entire length. For example, if no larger IC such as an AMB is employed, a typical memory module 10 comprising constituent: CSP ICs 18 along its length may have a cross-sectional aspect that may be represented by the depiction of FIG. 3 when flex circuit 12 is populated on both sides while thermal spreaders 13$_1$ and 13$_2$ are disposed adjacent and thermally connected to ICs 18B which are populated on side 8 of flex: circuit 12 as further shown in FIG. 7. Reference to FIG. 7 illustrates that the ICs 18B represented as being thermally connected to thermal spreaders 13$_1$ and 13$_2$ are disposed in two ranks separated by contacts 20.

It should be recognized that optional substrate extension 16T enables a thermal conduction path for thermal energy to flow from inner ICs 18A (shown proximal to substrate 14 in FIG. 3) into thermal spreaders 13$_1$ and 13$_2$ through the thermal connection shown extant between substrate 14 and thermal spreaders 13$_1$ and 13$_2$ effectuated by substrate extension 16T in thermal connection with thermal spreader extensions 13$_1$A and 13$_2$A, respectively.

Figure 4:
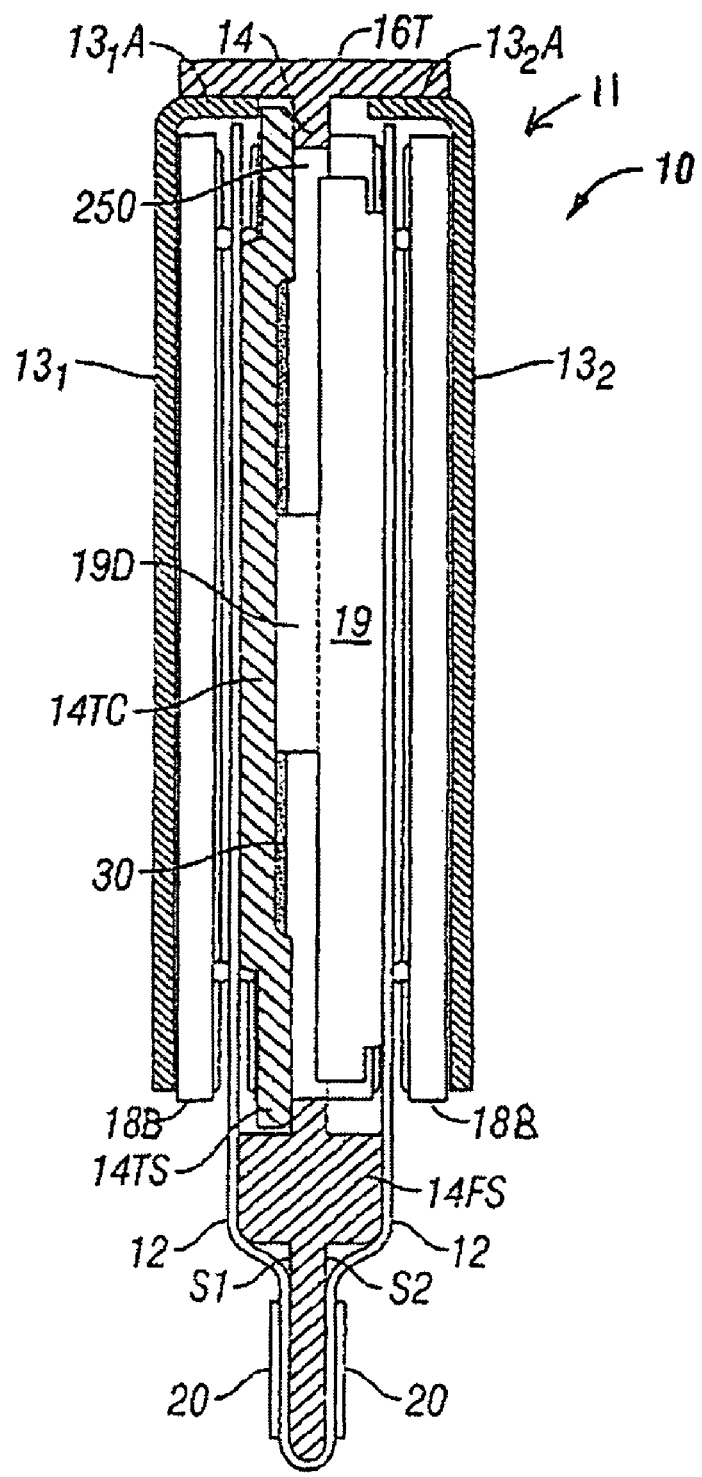
FIG. 4 is a cross-sectional view of a preferred embodiment taken along a perspective line that corresponds to line C-C of FIG. 1.

FIG. 4 is a cross-sectional view of an exemplar module 10 that employs a larger IC 19 such as an AMB 19 with the view of FIG. 4 being taken along a line that corresponds to C-C of FIG. 1. FIG. 4 shows a substrate 14 with a window 250 through which an optional thermal sink 14TS is accessible. Thermal sink 14TS is comprised, in this preferred embodiment, from metallic material of high thermal conductivity such as, for example, copper or copper alloy and has, in this preferred embodiment, a central portion 14TC that is a copper field substantially larger than and preferably in thermal contact with IC 19 which, in this preferred embodiment, is an AMB. AMB die 19D is in contact with area 14TC of thermal sink 14TS either directly, or through thermally conductive adhesive or a thermally conductive gasket material, for example. Thermal contact with a part of circuit 19 should be considered thermal contact with circuit 19.

In this preferred embodiment, central portion 14TC of thermal sink 14TS is raised above the periphery of thermal sink 14TS and additionally provides an indentation into which may be introduced at least a portion of AMB circuit 19 such as, for example, AMB die 19D, to assist in realization of a low profile for module 10. Neither thermal sink 14TS nor an indentation are required, however, to practice the invention. In the preferred depicted embodiment, thermal sink 14TS is disposed over a window 250 through substrate 14. AMB circuit 19, which is mounted on the "inside" of flex circuit 12, is disposed, at least in part, into window 250 from the "back" side of substrate 14 to realize thermal contact with thermal sink 14TS to provide a conduit to reduce thermal energy loading of AMB circuit 19.

Thermal sink 14TS need not cover the entirety of window 250. In other embodiments, for example, thermal sink 14TS may merely be across the window 250 or thermal sink 14TS may be set into window 250 instead of over or across the opening of window 250. Thermal sink 14TS is typically a separate piece of metal from substrate 14 but, after appreciating this specification, those of skill will recognize that, in alternative instances, thermal sink 14TS may be integral with substrate 14 or a particular portion of substrate 14 may be constructed to be a thermal sink 14TS in accordance with the teachings herein. For example, substrate 14 may be comprised of aluminum, while a thermal sink area 14TS of substrate 14 may be comprised of copper yet substrate 14 and thermal sink 14TS are of a single piece. In a variation of the integral thermal sink-substrate embodiment, the thermal sink could be attached to the substrate without a window and thus be preferentially accessible only on one side of substrate 14. Construction expense will be more likely to militate against such construction but the principles of the invention encompass such constructions. Consequently, a window in substrate 14 is not required to practice some embodiments of the invention. Therefore, a thermal sink 14TS should be considered to be an area or element integral with or attached to a substrate 14 and the material from which that thermal sink is composed exhibits greater thermal conductivity than the material of the substrate. To continue the example, substrate 14 may be aluminum while thermal sink 14TS is comprised of copper.

Substrate 14 has first and second lateral sides identified as S$_1$ and S$_2$. Flex 12 is wrapped about perimeter edge 16A of substrate 14. Some alternative embodiments may employ individual flex circuits on each side of substrate 14. As will be further shown, AMB circuit 19 is mounted on inner side 9 of flex circuit 12. When flex circuit 12 is disposed about substrate 14, AMB circuit 19 is introduced, at least in part, into window 250 with AMB die 19D being disposed, preferably, in thermal contact with thermal sink 14TS of substrate 14. That thermal contact is preferably through thermally conductive adhesive 30 but, in an alternative embodiment, another preferred construction may place AMB die 19D in direct physical contact with thermal sink 14TS to realize the thermal contact or connection between AMB circuit 19 and thermal sink 14TS. Other thermal conduction enhancing materials may also be used in place of, or addition to thermal adhesive 30 such as for example, thermal grease or a thermal gasket.

In FIGS. 3 and 4, thermal spreaders $13_1$ and $13_2$ exhibit optional thermal spreader extensions $13_1$A and $13_2$A which, as previously described, provide a thermal conduction path for thermal energy from the inner ICs 18A. They also, as shown, in cooperation with extension 16T, form a thermally conductive enclosure 11 over module 10. Thermal spreader extensions are not required as a part of thermal spreaders $13_1$ and $13_2$, but where employed as those of skill will recognize, they may provide thermal or structural advantages.

Figure 5:
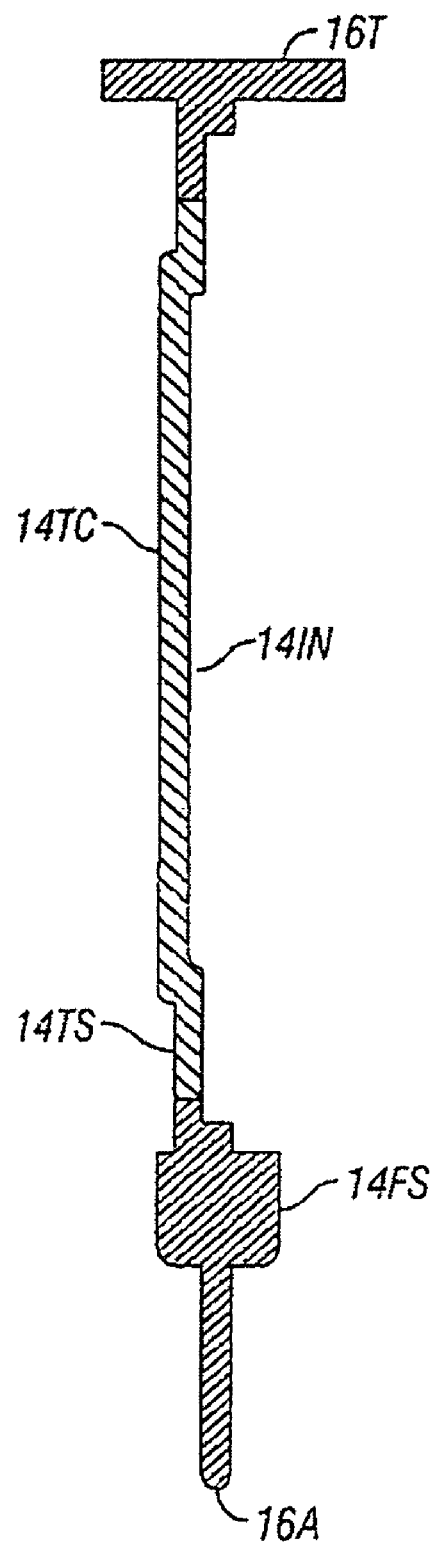
FIG. 5 is a depiction of a substrate employed in a preferred embodiment of the present invention.

In FIG. 5 a depicted substrate 14 is shown as having an integral thermal sink 14TS. The different materials used for the thermal sink 14TS as opposed to the substrate in general which result in the different thermal conductivity characteristics between substrate 14 and thermal sink 14TS are represented by the different hatching of the FIG. 5. For example, thermal sink 14TS in this depiction may be copper, for example, while the main body of substrate 14 may be comprised of aluminum, to name just one example. Another example could be a plastic bodied substrate 14 and a copper based thermal sink 14TS. Flex support 14FS is also shown in FIG. 5 and is typically comprised of the same material as substrate 14.

Figure 6:
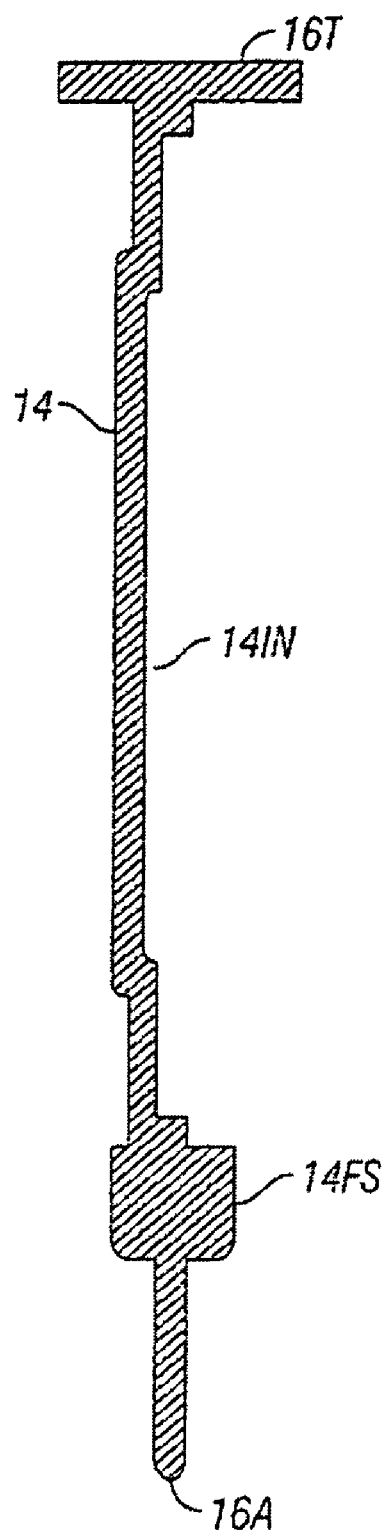
FIG. 6 illustrates a substrate employed with an alternative embodiment of the present invention in which an area of the substrate is deformed to provide an indentation.

Despite the advantages of using a thermal sink with module 10, for cost reasons, amongst other rationales, some may wish to construct modules with low profiles lacking the conductivity differential of that feature. In that case, FIG. 6 illustrates a substrate employed with another alternative embodiment of the present invention in which an area of the substrate is deformed to provide an indentation but no thermal sink 14TS is employed. Thus, embodiments that employ substrates such as that depicted in FIG. 6 will not have a thermal sink, but may rely on thermal connection or contact between substrate 14 and IC 19 to dissipate heat generated by IC 19 where IC 19 has been mounted on inner side 9 of flex circuit 12 as shown later. As those of skill will note, indentation 14IN is not required but provides low profile advantages.

Consequently, an exemplar embodiment that employed a substrate such as that shown in FIG. 6 and does not exhibit a thermal sink 14TS would look very much like the embodiment shown in FIG. 4 except that the structure labeled 14TS would not be separate from substrate 14 and would be a part of substrate 14 and composed from the same material. Further, no window 250 would be present since no opening in substrate 14 would be needed. IC 19 would preferably be in thermal contact with substrate 14.

Where a window 250 in substrate 250 is employed, at least a part of thermal sink 14TS should be accessible through window 250 from the "other" side of substrate 14. AMB circuit 19 or other high heat IC 19 and, in particular, AMB die 19D, may be disposed in or across or over window 250 and preferably, will be introduced into an indentation of thermal sink 14TS and disposed in thermal contact with thermal sink 14TS and, more preferably, with the central core 14TC of thermal sink 14TS (where a central core has been optionally included in thermal sink 14TS) either with direct contact or through thermal adhesives or glues. Other embodiments may include additional windows where other high heat circuits are employed on module 10. Still other embodiments may insert some or all of ICs 18 into cutout areas in substrate 14 as described in detail in U.S. patent application Ser. No. 11/005,992 which has been incorporated by reference herein.

In a preferred embodiment, thermal sink 14TS covers window 250 on one side of substrate 14 while AMB circuit 19 is disposed, at least in part, into window 250 to realize contact between thermal sink 14TS and AMB circuit 19 and particularly AMB die 19D either directly or as mediated through a thermally-conductive adhesive or glue.

FIG. 7 depicts a first side 8 of flex circuit 12 ("flex", "flex circuitry", "flexible circuit") used in constructing a module according to an embodiment of the present invention. Flex circuit 12 is preferably made from one or more conductive layers supported by one or more flexible substrate layers as further described with reference to later FIG. 12. The construction of flex circuitry is known in the art. The entirety of the flex circuit 12 may be flexible or, as those of skill in the art will recognize, the flexible circuit structure 12 may be made flexible in certain areas to allow conformability to required shapes or bends, and rigid in other areas to provide rigid and planar mounting surfaces. Preferred flex circuit 12 has openings 17 for use in aligning flex circuit 12 to substrate 14 during assembly.

The depiction of FIG. 7 shows flex circuit 12 as having first and second fields or ranks of ICs 18 with contacts 20 being disposed between said ranks or fields of ICs 18. After flex circuit is assembled with substrate 14, those of skill will recognize that contacts 20 may appear on one or both sides of module 10 depending on the mechanical contact interface particulars of the application. Other embodiments may employ flex circuitry that exhibits contacts closer to an edge of the flex circuit.

Flex circuit 12 may also referenced by its perimeter edges, two of which are typically long ($PE_{long1}$ and $PE_{long}2$) and two of which are typically shorter ($P_{short1}$ and $PE_{short2}$) although flex circuit 12 may come in a variety of shapes including square. Contact arrays such as array 11A are disposed beneath, ICs 18 and IC 19, where employed, and are comprised of array contacts 11C. An exemplar contact array 11A is shown as is exemplar IC 18 to be mounted at contact array 11A as depicted.

Figure 8:
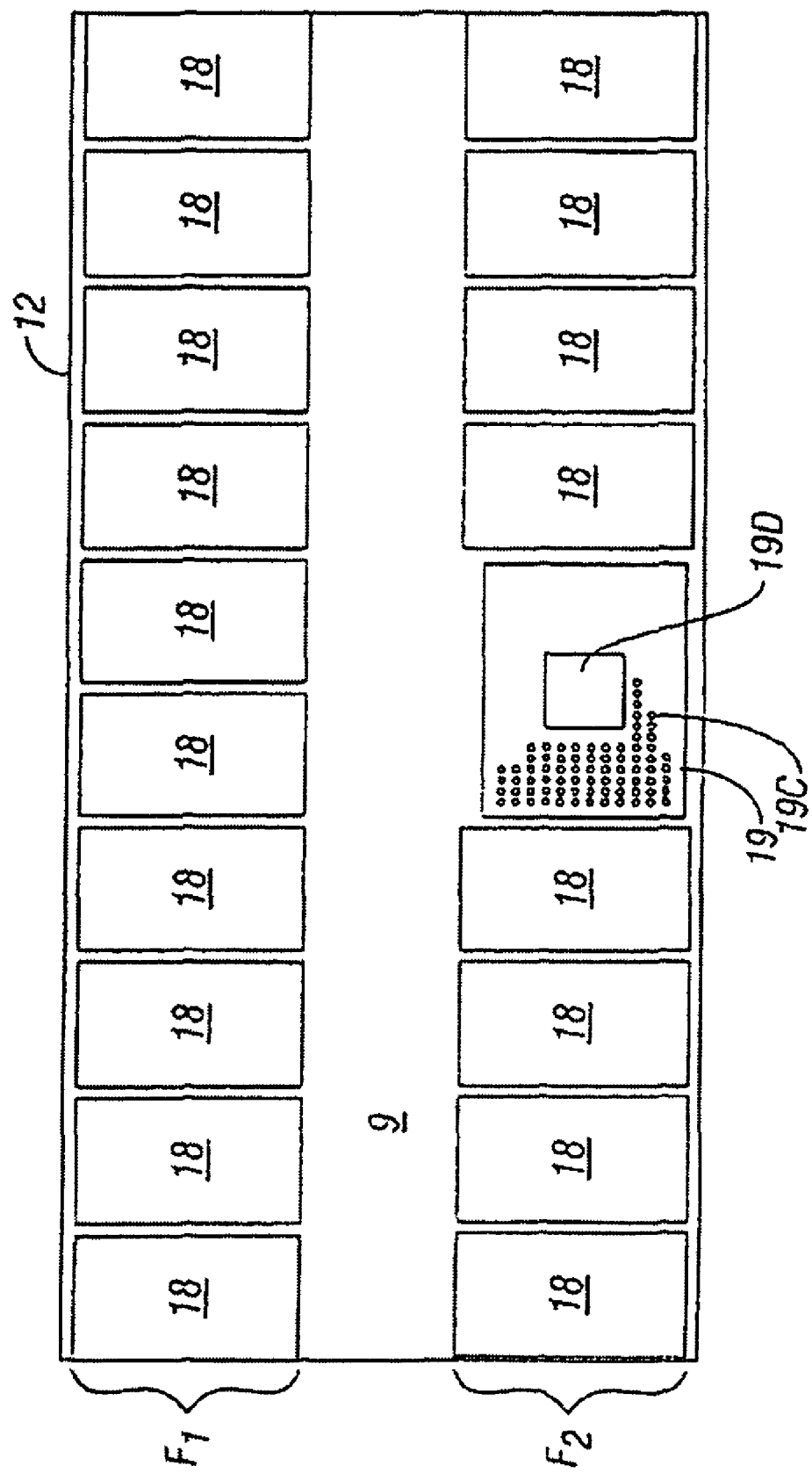
FIG. 8 depicts another side of the flex circuit depicted in FIG. 7.

A first rank, group or plurality of ICs 18 is shown on side 8 of flex circuit 12 and is identified as $IC_{R1}$ and: a second rank, group or plurality of CSPs on side 8 is identified as $IC_{R2}$. Those of skill will recognize that the identified pluralities of CSPs are, when disposed in the configurations depicted, typically described as "ranks". Between the ranks $IC_{R2}$ and $IC_{R2}$, flex circuit 12 bears a plurality of module contacts allocated in this embodiment into two rows ($C_{R1}$ and $C_{R2}$) of module contacts 20. When flex circuit 12 is folded about substrate 14 as earlier depicted, side 9 which is depicted in later FIG. 8, is closer to the substrate 14 about which flex circuit 12 is disposed than is side 8 and thus, ICs 18A which are identified in the cross-sectional view of FIG. 3, for example, are populated along the inner side 9 of flex circuit 12 while those ICs 18B identified in FIG. 3 are populated along the outer side 8 of flex circuit 12. Other embodiments may have other numbers of ranks and combinations of plural CSPs connected to create the module of the present invention.

FIG. 7 depicts an exemplar conductive trace 21 connecting row $C_{R2}$ of module contacts 20 to ICs 18. Those of skill will understand that there are many such traces in a typical embodiment. Traces 21 may also connect to vias that may transit to other conductive layers of flex 12 in certain embodiments having more than one conductive layer. In a preferred embodiment, vias connect ICs 18 on side 9 of flex 12 to module contacts 20. An example via is shown as reference 23. Traces 21 may make other connections between the ICs on either side of flex 12 and may traverse the rows of module contacts 20 to interconnect ICs. Together the various traces and vias make interconnections needed to convey data and control signals amongst the various ICs and buffer circuits.

Those of skill will understand that the present invention may be implemented with only a single row of module contacts 20 and may, in other embodiments, be implemented as a module bearing ICs on only one side of flex circuit 12.

FIG. 8 shows side 9 of flex circuit 12 depicting the other side of the flex circuit shown in FIG. 7 as may be employed in a preferred embodiment. Side 9 of flex circuit 12 is shown as being populated with multiple CSPs 18 and AMB circuit 19. Side 9 includes fields F1 and F2 that each include at least one mounting contact array site for CSPs and, in the depicted case, include multiple contact arrays. Each of fields F1 and F2 include, in the depicted preferred embodiment, two pluralities of ICs in this embodiment. Other embodiments may have other arrangements and constituent ICs and, in some cases, may have ICs on only one side of flex circuit 12. Other embodiments may also have fewer or greater numbers of ranks or pluralities of ICs in each field or on a side of a flex circuit.

Figure 9:
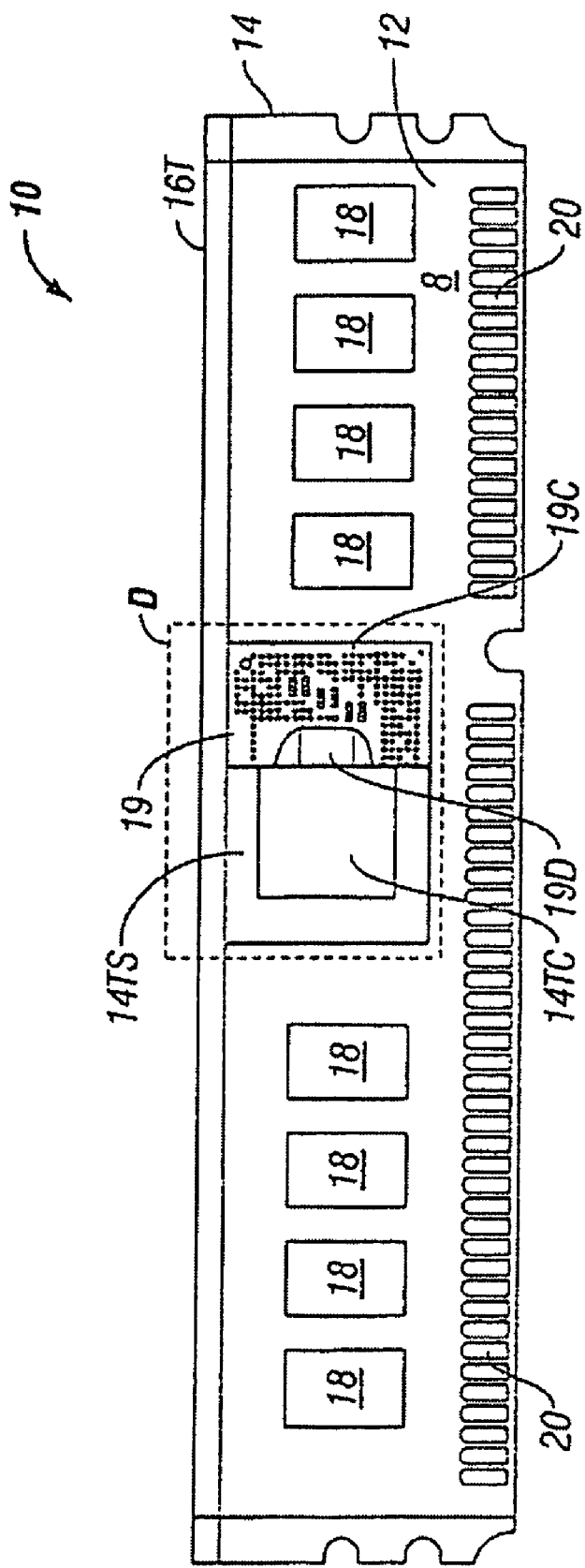
FIG. 9 is a view of a preferred embodiment before thermal spreaders devised in accordance with a preferred embodiment of the present invention are included in the module. A cutaway area D is provided to enhance illustration of certain features.

FIG. 9 is a view of a preferred embodiment before thermal spreaders devised in accordance with a preferred embodiment of the present invention are appended about the module. A cutaway area D is provided to enhance illustration of certain features.

Flex circuit 12 is, cutaway in area "D" to illustrate internal preferred features of module 10. Area "D" is shown in greater enlargement in later FIG. 10. Within area D are seen thermal sink 14TS and beyond the cutaway section of thermal sink 14TS, there is shown a part of a circuit 19 which, in the depicted preferred embodiment, is an AMB employed in FB-DIMM circuitry. AMB circuit 19 includes AMB die 19D and contacts 19C.

Figure 10:
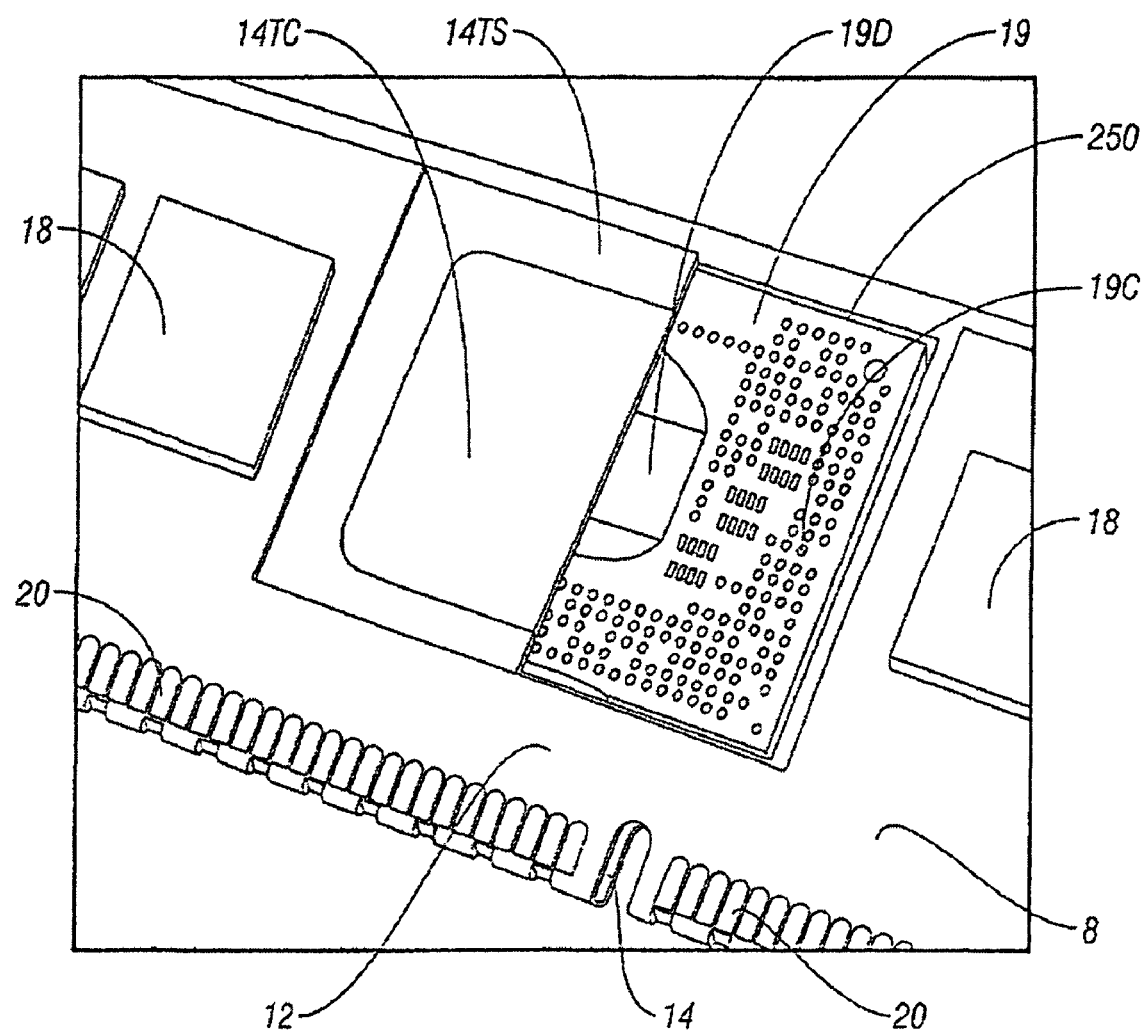
FIG. 10 is an enlarged depiction of the area identified with "D" in FIG. 9.

FIG. 10 is an enlarged depiction of the area D identified in FIG. 9 of an exemplar module 10 depicting in partial cutaway, details concerning the relationship between a high heat IC 19 such as an AMB 19 and substrate 14 in a preferred embodiment. This view provides insight that would otherwise be blocked from view if thermal spreaders 13$_1$ and 13$_2$ were included in the depiction. AMB circuit 19 is shown through window 250 through substrate 14. Preferably, AMB circuit 19 is in mounted on what will become the internal side 9 of flex circuit 12 relative to module 10 and is, therefore, inserted into window 250 from the "rear" relative to the perspective shown in FIG. 10. Those of skill will recognize, particularly with reference to FIG. 10, that a portion of flex circuit 12 has been removed to expose thermal sink 14TS and a part of 14TS has also been cutaway.

Figure 11:
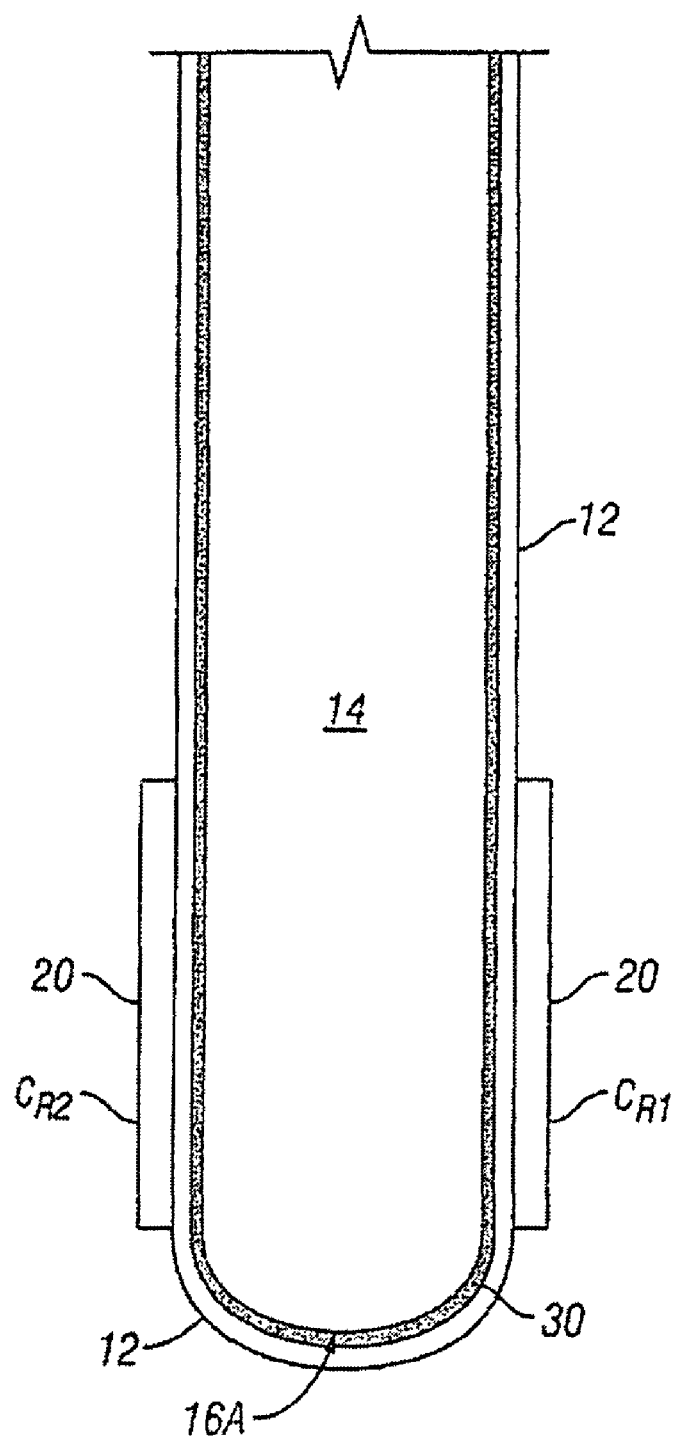
FIG. 11 is a cross-sectional depiction of the area near an end of a substrate as employed in a preferred embodiment of the present invention.

FIG. 11 depicts an enlarged view of the area near end or edge 16A of an exemplar module 10. While a rounded configuration is shown, edge 16A may take on other shapes devised to mate with various connectors or sockets. The form and function of various edge card connectors are well know in the art. In many preferred embodiments, flex 12 is wrapped around edge 16A of substrate 14 and may be laminated or adhesively connected to substrate 14 with adhesive 30. The depicted adhesive 30 and flex 12 may vary in thickness and are not drawn to scale to simplify the drawing. The depicted substrate 14 has a thickness such that when assembled with the flex 12 and adhesive 30, the thickness measured between module contacts 20 falls in the range specified for the mating connector. In some other embodiments, flex circuit 12 may be implemented with two flex circuits 12A and 12B instead of one wrapped about end 16A. For example, a flex circuit 12A may be disposed on one side of module 10 while another flex circuit 12B may be disposed on an other side of module 10. Adhesive 30 is employed to attached flex circuit 12 to substrate 14 and contacts 20 are disposed on each side of module 10. In other embodiments, contacts 20 need not be on both sides of module 10 and may be exhibited on only one side in configurations.

Figure 12:
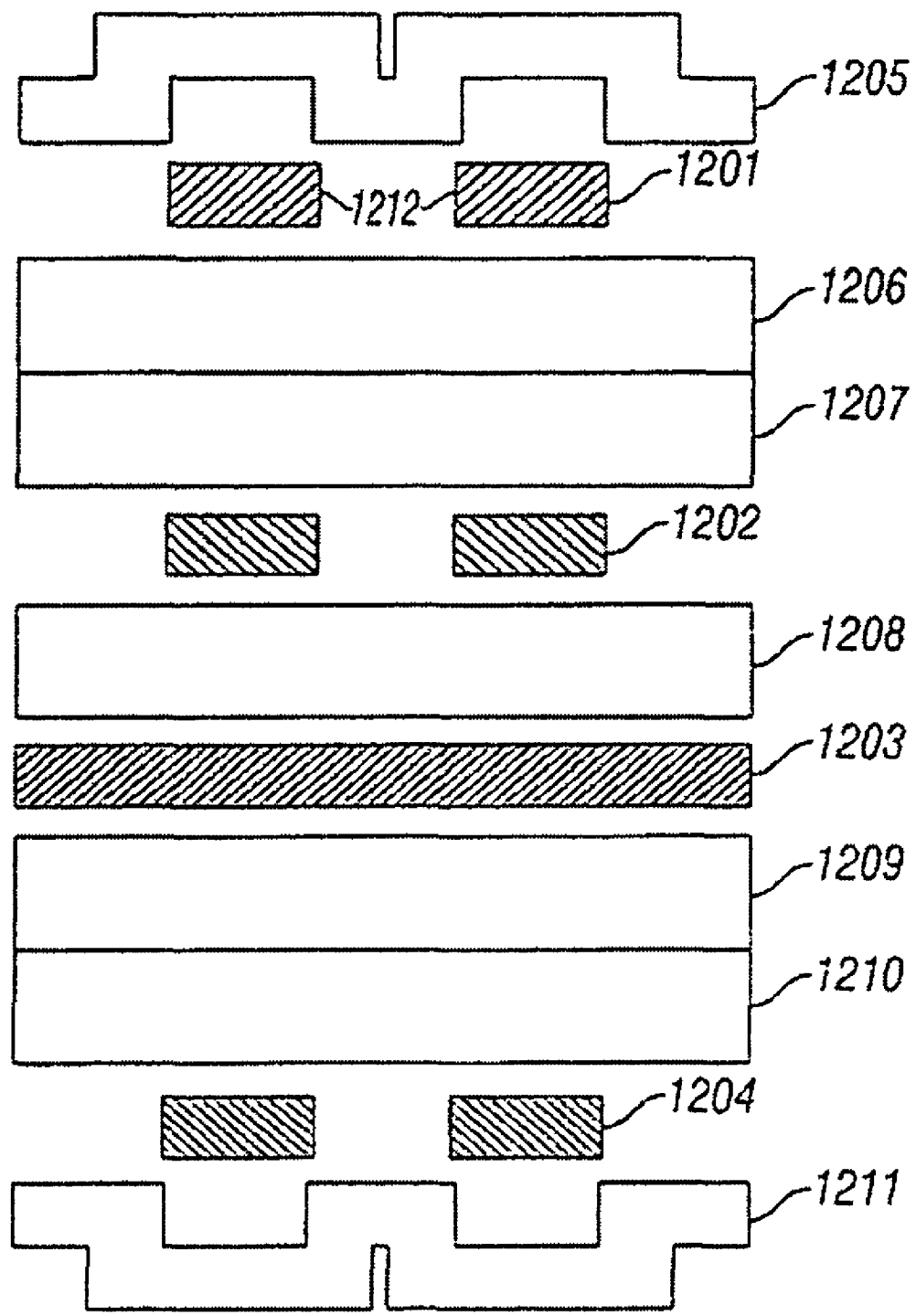
FIG. 12 is an exploded cross-sectional view of a flex circuit employed in a preferred embodiment of the present invention.

FIG. 12 is an exploded depiction of a flex circuit 12 cross-section according to one preferred embodiment of the present invention. The depicted flex circuit 12 has four conductive layers 1201-1204 and seven insulative layers 1205-1211. The numbers of layers described are merely those used in one preferred embodiment and other numbers of layers and arrangements of layers may be employed. Even a single conductive layer flex circuit 12 may be employed in some embodiments, but flex circuits with more than one conductive layer prove to be more adaptable to more complex embodiments of the invention.

Top conductive layer 1201 and the other conductive layers are preferably made of a conductive metal such as, for example, copper or alloy 110. In this arrangement, conductive layers 1201, 1202, and 1204 express signal traces 1212 that make various connections by use of flex circuit 12. These layers may also express conductive planes for ground, power or reference voltages.

In this embodiment, inner conductive layer 1202 expresses traces connecting to and among various ICs. The function of any one of the depicted conductive layers may be interchanged in function with others of the conductive layers. Inner conductive layer 1203 expresses a ground plane, which may be split to provide VDD return for pre-register address signals. Inner conductive layer 1203 may further express other planes and traces. In this embodiment, floods or planes at bottom conductive layer 1204 provides VREF and ground in addition to the depicted traces.

Insulative layers 1205 and 1211 are, in this embodiment, dielectric solder mask layers which may be deposited on the adjacent conductive layers for example. Other embodiments may not have such adhesive dielectric layers. Insulating layers 1206, 1208, and 1210 are preferably flexible dielectric substrate layers made of polyimide. However, any suitable flexible circuitry may be employed in the present invention and the depiction of FIG. 12 should be understood to be merely exemplary of one of the more complex flexible circuit structures that may be employed as flex circuit 12.

Figure 13:
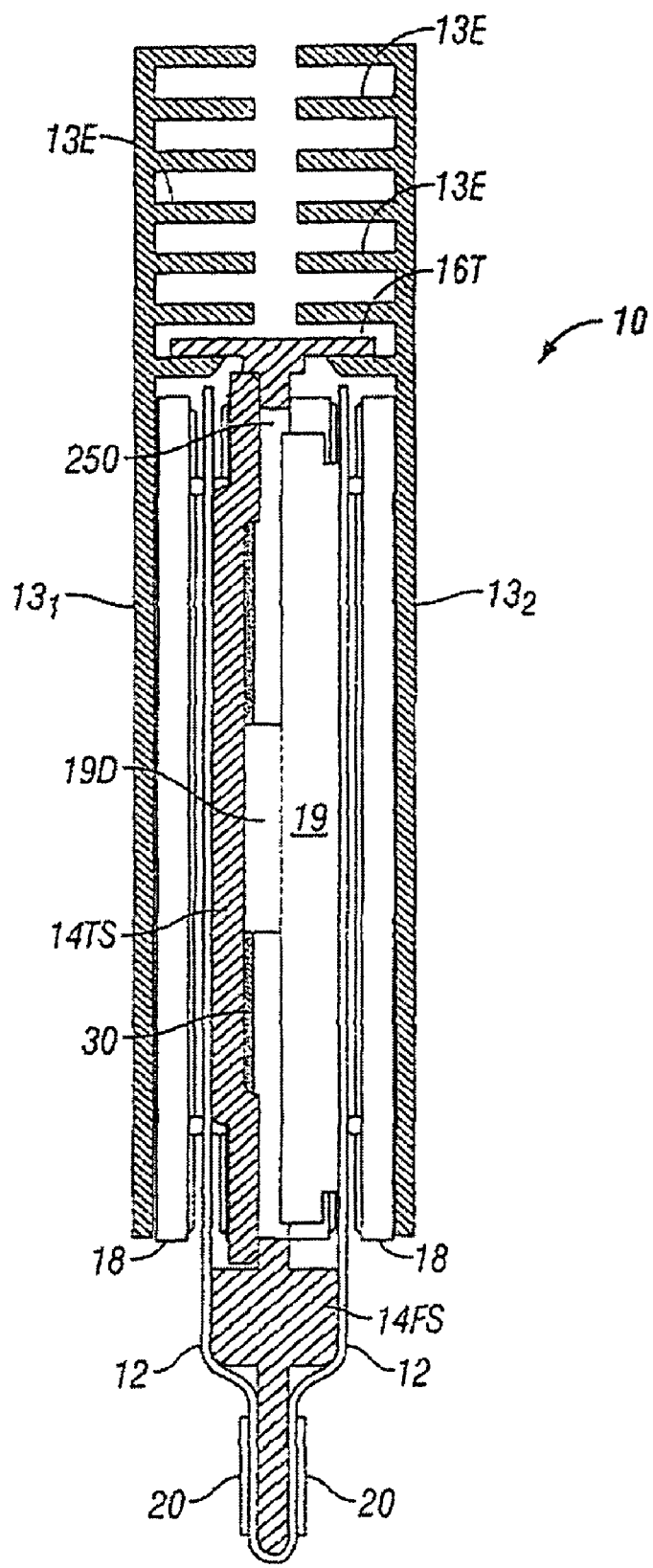
FIG. 13 is a cross-sectional view of another preferred embodiment devised in accordance with the invention.
Figure 14:
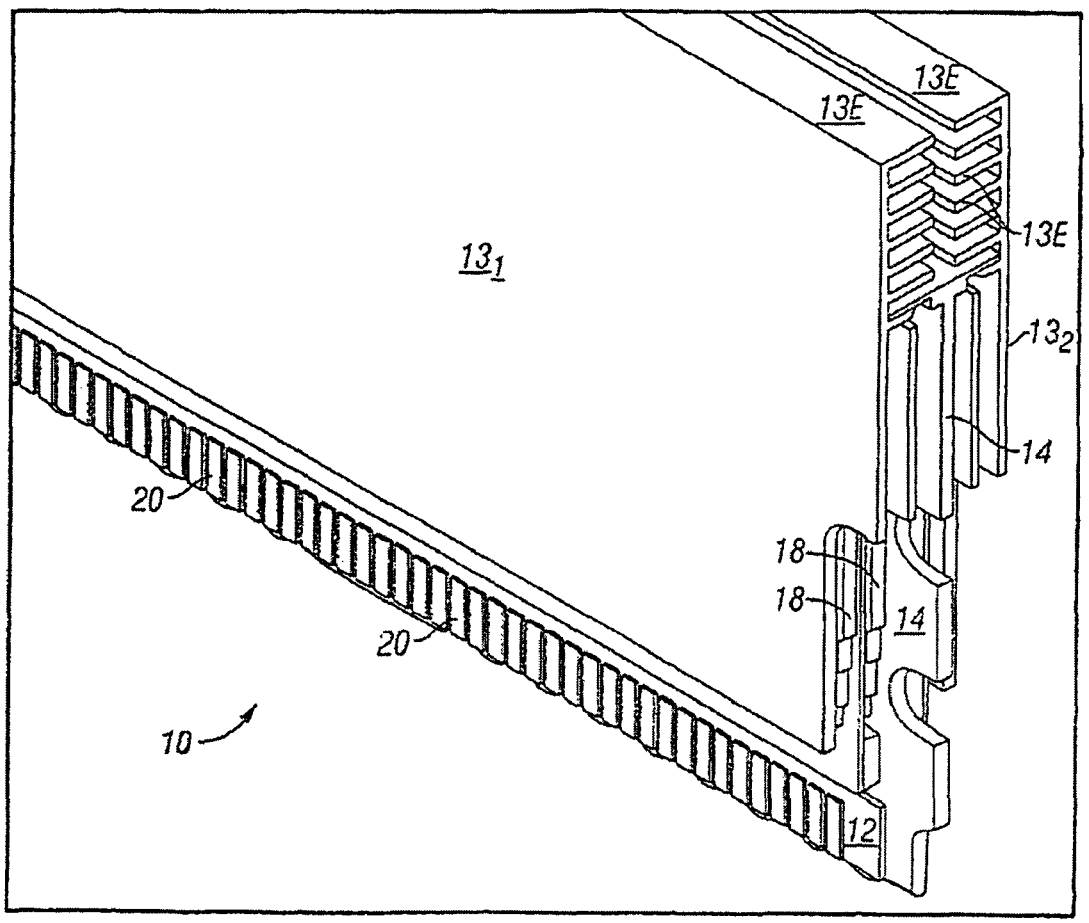
FIG. 14 is an enlarged perspective view of the preferred embodiment of FIG. 13 devised in accordance with the present invention.

FIG. 13 depicts another preferred embodiment in accordance with the present invention. The depicted module 10 includes thermal spreaders 13$_1$ and 13$_2$ configured with plural extensions 13E which reside above substrate extension 16T and project inwardly. As those of skill will recognize, plural spreader extensions will encourage thermal shedding from the module. FIG. 14 provides a perspective view of a module 10 shown in cross-section in prior FIG. 13.

Figure 15:
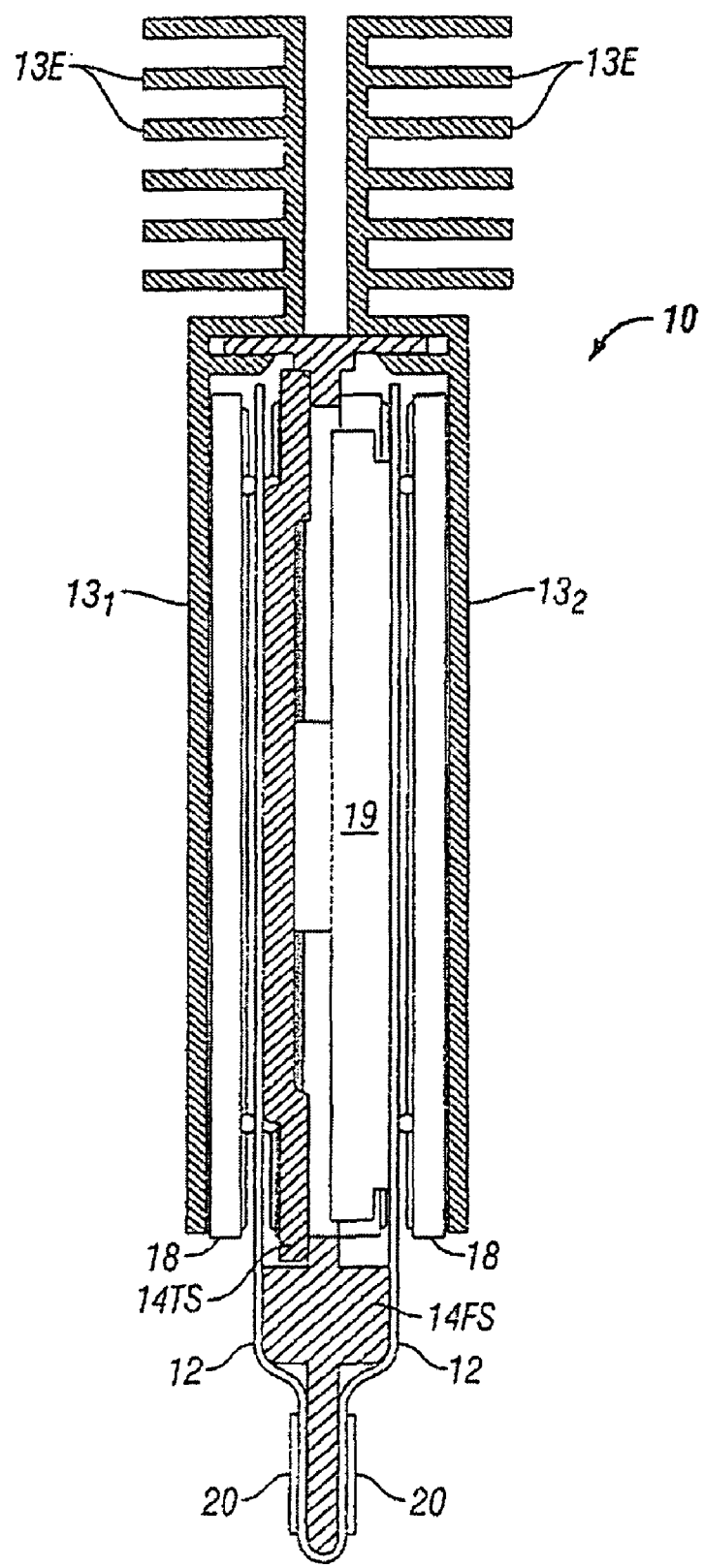
FIG. 15 is another cross-sectional view of another preferred embodiment devised in accordance with the invention.
Figure 16:
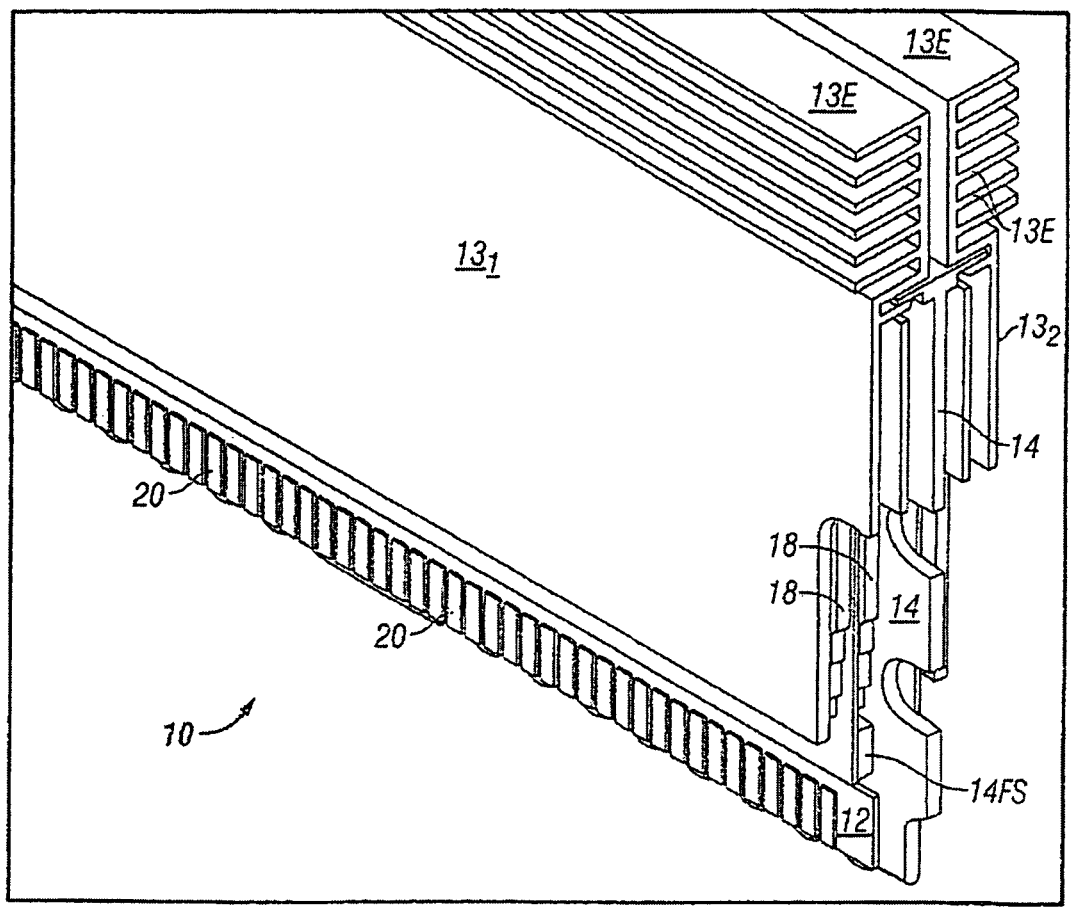
FIG. 16 is an enlarged perspective view of the preferred embodiment of FIG. 15 devised in accordance with the present invention.

FIG. 15 depicts another preferred embodiment in accordance with the present invention. The module 10 depicted in FIG. 15 exhibits plural spreader extensions above substrate extension 16T but unlike the plural spreader extensions depicted in FIG. 13, the spreader extensions 13E exhibited by the module 10 depicted in FIG. 15 project outwardly. FIG. 16 depicts a perspective view of a module 10 with plural thermal spreader extensions that project outwardly above substrate extension 16T.

Figure 17:
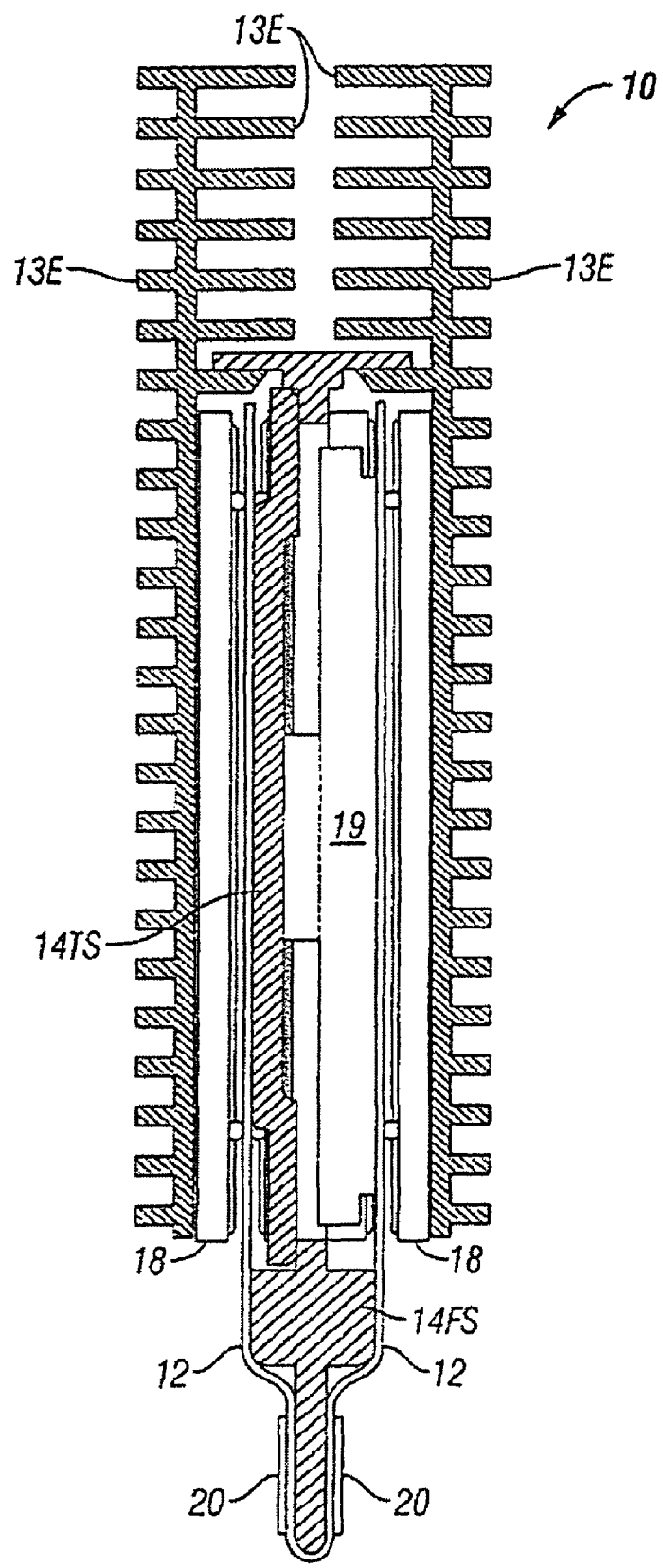
FIG. 17 is another cross-sectional view of another preferred embodiment devised in accordance with the invention.

FIG. 17 depicts an exemplar module 10 that exhibits multiple radiative projects from thermal spreaders 13$_1$ and 13$_2$ to provide even more surface area for thermal shedding from module 10.

One advantageous methodology for efficiently assembling an embodiment of a module 10 depicted herein is as follows. In a preferred method of assembling a preferred module assembly 10, flex circuit 12 is placed flat and both sides populated according to circuit board assembly techniques known in the art. Flex circuit 12 is then folded about end 16A of substrate 14. Flex 12 may be laminated or otherwise attached to substrate 14. Adhesives are employed to secure thermal conduction between outer ICs 18B and thermal spreaders 13$_1$ and 13$_2$ while additional thermally conductive adhesive may be employed between substrate extension 16T and thermal spreader extensions 13$_1$A and 13$_2$A where such structures are employed in module 10.

Although the present invention has been described in detail, it will be apparent to those skilled in the art that many embodiments taking a variety of specific forms and reflecting changes, substitutions and alterations can be made without departing from the spirit and scope of the invention. Therefore, the described embodiments illustrate but do not restrict the scope of the claims.

The invention claimed is:

1. A circuit module, comprising:
   a rigid substrate having two opposing lateral sides, an extension and an edge and a thermal sink accessible on at least one of the two opposing lateral sides of the substrate;
   a flex circuit having first and second sides, the first side of the flex circuit having plural contacts adapted for connection to a circuit board socket and at least the first of the first and second sides of the flex circuit being populated with plural memory CSPs with the second major side of the flex circuit being populated with at least an AMB, the flex circuit being disposed about the edge of the rigid substrate to dispose the AMB in thermal contact with the thermal sink; and
   at least one thermal spreader which is thermally connected to and adjacent to at least some of the plural memory CSPs and connected to the extension of the rigid substrate.

2. The circuit module of claim 1 in which the rigid substrate is comprised of thermally conductive material.

3. The circuit module of claim 1 in which at least a portion of the thermal sink provides an indentation into which, at least in part, a portion of the AMB is introduced.

4. The circuit module of claim 1 in which the thermal contact is realized through thermally conductive adhesive.

5. The circuit module of claim 1 in which both the first and second sides of the flex circuit are populated with plural memory CSPs.

6. The circuit module of claim 1 in which the rigid substrate and the at least one thermal spreader cooperate to provide a thermal conduction path between the substrate and the at least some of the plural ICs.

* * * * *